US009553005B2

(12) United States Patent
Tice

(10) Patent No.: US 9,553,005 B2
(45) Date of Patent: Jan. 24, 2017

(54) METAL LIFTOFF TOOLS AND METHODS

(71) Applicant: MEI, LLC, Albany, OR (US)

(72) Inventor: Scott Tice, Albany, OR (US)

(73) Assignee: MEI, LLC, Albany, OR (US)

( * ) Notice: Subject to any disclaimer, the term of this patent is extended or adjusted under 35 U.S.C. 154(b) by 0 days.

(21) Appl. No.: 14/737,143

(22) Filed: Jun. 11, 2015

(65) Prior Publication Data

US 2015/0279701 A1 Oct. 1, 2015

Related U.S. Application Data

(62) Division of application No. 14/097,511, filed on Dec. 5, 2013, now Pat. No. 9,070,631.

(Continued)

(51) Int. Cl.
*H01L 21/306* (2006.01)
*H01L 21/67* (2006.01)
(Continued)

(52) U.S. Cl.
CPC ........... *H01L 21/67057* (2013.01); *B08B 3/00* (2013.01); *B08B 3/02* (2013.01); *B08B 3/024* (2013.01); *B08B 3/04* (2013.01); *B08B 3/045* (2013.01); *B08B 3/048* (2013.01); *H01L 21/02052* (2013.01); *H01L 21/0272* (2013.01); *H01L 21/30604* (2013.01); *H01L 21/6704* (2013.01); *H01L 21/6708* (2013.01); *H01L 21/67017* (2013.01); *H01L 21/67023* (2013.01);
(Continued)

(58) Field of Classification Search
None
See application file for complete search history.

(56) References Cited

U.S. PATENT DOCUMENTS 5,932,027 A * 8/1999 Mohindra ................ B08B 3/10
134/2
8,216,417 B2 7/2012 Fujiwara et al.
(Continued)

FOREIGN PATENT DOCUMENTS

CN 101546701 9/2009
CN 104051296 9/2014
(Continued)

OTHER PUBLICATIONS

Extended Search Report for EP14155486.5 (mailed Sep. 23, 2014).
(Continued)

*Primary Examiner* — Jiong-Ping Lu
(74) *Attorney, Agent, or Firm* — Klarquist Sparkman, LLP

(57) ABSTRACT

In certain embodiments the metal liftoff tool comprises an immersion tank for receiving a wafer cassette with wafers therein, the immersion tank including an inner weir, a lifting and lowering mechanism capable of raising and lowering the wafer cassette while submerged in fluid in the immersion tank, low pressure high velocity primary spray jets for stripping the metal, the primary spray jets positioned at opposing sides of the immersion tank parallel to the wafer surfaces planes, and secondary spray jets for pressure equalization force, positioned at the bottom of the immersion tank. A wafer lift insert is positioned at the bottom of the immersion tank to receive and periodically lift the wafers within the cassette.

13 Claims, 21 Drawing Sheets

Related U.S. Application Data

(60) Provisional application No. 61/785,233, filed on Mar. 14, 2013.

(51) Int. Cl.
*H01L 21/02* (2006.01)
*B08B 3/02* (2006.01)
*B08B 3/04* (2006.01)
*B08B 3/00* (2006.01)
*H01L 21/687* (2006.01)
*H01L 21/677* (2006.01)
*H01L 21/027* (2006.01)

(52) U.S. Cl.
CPC .. *H01L 21/67063* (2013.01); *H01L 21/67086* (2013.01); *H01L 21/67757* (2013.01); *H01L 21/68742* (2013.01)

(56) References Cited

U.S. PATENT DOCUMENTS

| | | |
|---|---|---|
| 9,230,836 B2 | 1/2016 | Higuchi et al. |
| 2007/0267040 A1 | 11/2007 | Watanabe et al. |
| 2009/0242517 A1 | 10/2009 | Fujiwara et al. |
| 2011/0126860 A1* | 6/2011 | Hyakutake ........ H01L 21/67057 134/19 |
| 2012/0240958 A1 | 9/2012 | Higuchi et al. |

FOREIGN PATENT DOCUMENTS

| | | | |
|---|---|---|---|
| EP | 2779211 | 9/2014 | |
| JP | 2001-274133 | * 5/2001 | ........... H01L 21/304 |
| JP | 2005-244130 | 9/2005 | |
| KR | 20120109311 | 10/2012 | |
| KR | 20140113356 | 9/2014 | |
| TW | 201250902 | 12/2012 | |

OTHER PUBLICATIONS

Malaysian Patent Application No. PI2014700285, filed Feb. 10, 2014 (not yet published) corresponding to U.S. Appl. No. 14/097,511.
Notice of Allowance from the U.S. Patent and Trademark Office for U.S. Appl. No. 14/097,511 (mailed May 21, 2015).
Office Action from the Korean Intellectual Property Office for Korean Patent Application No. 10-2014-0024649 (mailed Apr. 18, 2015) (and English translation).
Office Action from the U.S. Patent and Trademark Office for U.S. Appl. No. 14/097,511 (mailed Dec. 24, 2014).
Philippian Patent Application No. 1-2014-000081, filed Mar. 5, 2014 (not yet published) corresponding to U.S. Appl. No. 14/097,511.
Restriction Requirement from the U.S. Patent and Trademark Office for U.S. Appl. No. 14/097,511 (mailed Oct. 24, 2014).
Singapore Patent Application No. 2014014039, filed Feb. 13, 2014 (not yet published) corresponding to U.S. Appl. No. 14/097,511.
Office Action received from Chinese Patent Office for Chinese Patent Application No. 201410072689.9 (mailed Apr. 5, 2016).

* cited by examiner

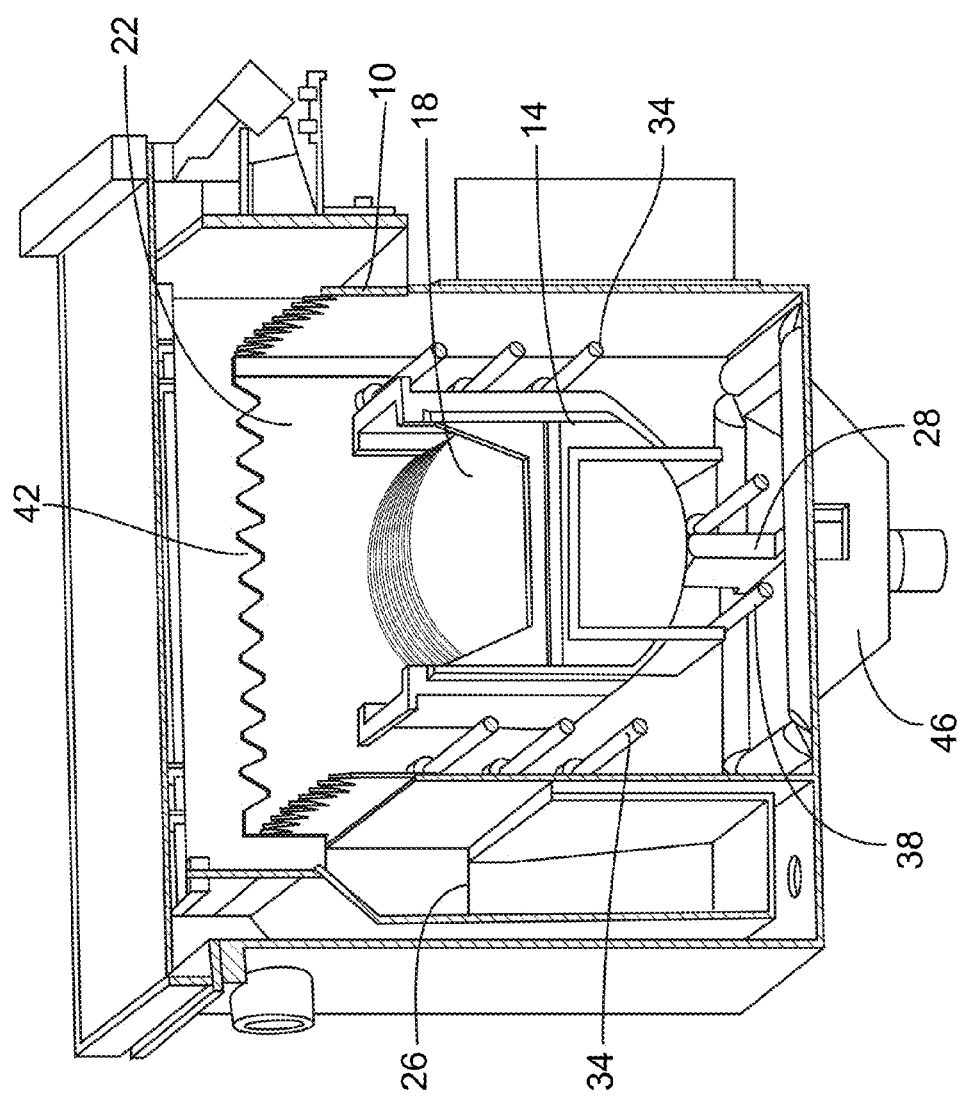

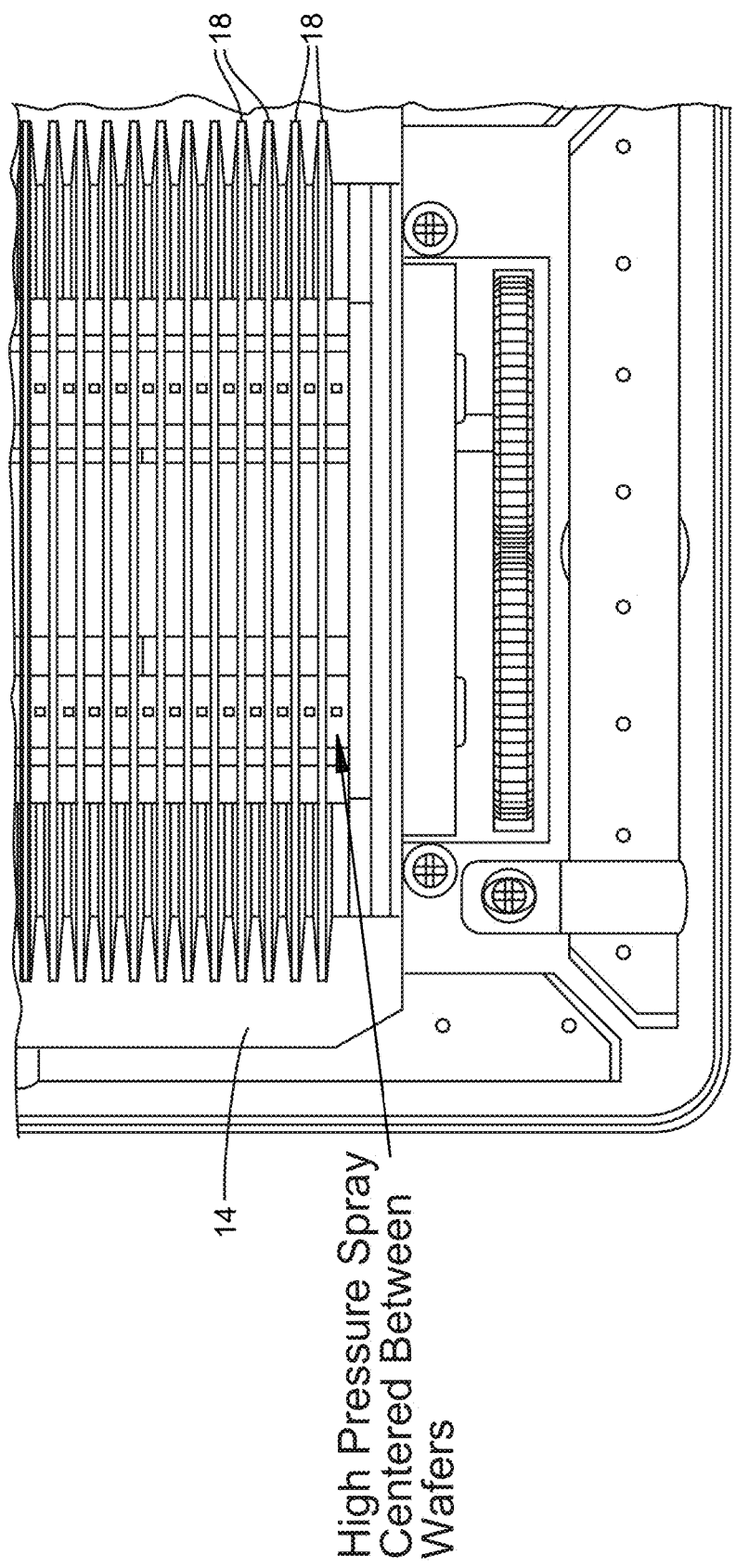

Scale 1:24

METAL LIFTOFF TOOLS AND METHODS

CROSS REFERENCE TO RELATED APPLICATION

This application is a divisional of U.S. patent application Ser. No. 14/097,511, filed Dec. 5, 2013, now U.S. Pat. No. 9,070,631, which claims the benefit of U.S. Provisional Patent Application No. 61/785,233, filed Mar. 14, 2013, which are hereby incorporated by reference.

FIELD

Disclosed are apparatus and methods for manufacturing semiconductor devices; particularly, apparatus and methods for performing metal liftoff processes.

BACKGROUND

In the fabrication of semiconductors and electronic components there are generally two types of etching processes used to form metal layers and structures on substrates. The "subtractive" or "etch-back" approach is to first deposit metal over the entire substrate surface followed by subsequent patterning of a resist etch mask on top of the metal and then selectively removing the metal in unwanted areas by wet or dry etching. The "additive" or "liftoff" approach is to do metal liftoff in which resist is first patterned on the substrate surface followed by subsequent deposition of metal by sputter deposition or evaporation method. The sacrificial resist layer is then dissolved in a suitable solvent, lifting off the metal on top of the resist and leaving only metal in the resist opening areas on the substrate. The "liftoff" technique allows easy creation of metal patterns comprising different metal layers whereas selective removal of all the metal layers in the "etch-back" approach is not always easy and straightforward.

SUMMARY

Lift-off tools and processes in microstructuring technology are used to create integrated circuits and other microdevice structures of a target material on the surface of a substrate (typically a semiconductor wafer) using a sacrificial material, typically photoresist. The scale of the structures can vary from the nanoscale up to the centimeter scale but are typically of micrometric dimensions.

The present tools and methods are for removing metal and/or other layers from a wafer surface processed to create integrated circuits via an additive process. The wafers to be processed by the disclosed metal liftoff tool and methods have been processed to have an inverse pattern created in a sacrificial stencil layer (e.g., photoresist), which was deposited on the surface of the wafer (or other substrate). Openings were then etched through the sacrificial layer so that the target material, typically metal, could be deposited on the surface of the wafer in those regions where the final pattern was to be created. A thin film or layer of metal was deposited over the surface of the wafer including over the sacrificial layer and exposed areas of the wafer surface. The disclosed tools and methods then undercut the sacrificial layer (e.g., photoresist in a solvent), and the metal on the top of the sacrificial layer is lifted off and removed. After the liftoff, the thin layer of metal remains only in the regions where it had a direct contact with the exposed wafer surface, in the desired pattern. Though disclosed are apparatus and methods for metal liftoff and resist stripping, for ease of discussion, the apparatus and methods are discussed primarily in terms of metal liftoff.

In certain embodiments the metal liftoff tool comprises an immersion tank for receiving a wafer cassette with wafers therein, the immersion tank including an inner weir, a lifting and lowering mechanism capable of raising and lowering the wafer cassette while submerged in fluid in the immersion tank, low pressure high velocity primary spray jets for stripping the metal, the primary spray jets positioned at opposing sides of the immersion tank, the opposing sidewalls being perpendicular to planes defined by wafer surfaces when the wafers are in the wafer cassette in the immersion tank, and secondary spray jets capable of providing pressure equalization force, the secondary spray jets positioned at the bottom of the immersion tank. A wafer lift insert is positioned at the bottom of the immersion tank to receive and periodically lift the wafers within the cassette.

In certain embodiments, the metal liftoff method comprises submerging a wafer cassette with wafers to be processed therein into a fluid in an immersion tank, the fluid being a liquid solvent for removing or wearing away the sacrificial resist layer under the metal layer to be lifted. Edges of the wafers proximal to the bottom of the immersion tank are periodically inserted into slots of the wafer lift insert as the lifting mechanism lowers the wafer cassette in the immersion tank. Streams of low pressure, high velocity fluid are sprayed from the primary spray jets positioned at side walls of the immersion tank in a direction parallel with the wafer surfaces thereby undercutting the resist layer and providing maximum metal stripping force across the entire surface of the wafers. The wafer cassette and wafers are cyclically raised and lowered in the immersion tank through the streams of fluid from the primary spray jets to provide a complete or substantially complete metal liftoff. Fluid is simultaneously and/or intermittently sprayed from one or more fluid jets positioned on the bottom of the immersion tank to provide pressure equalization forces that causes the majority of the stripped metal to move up to the top of the immersion tank and flow from the inner weir to the outer weir.

There are several currently available metal liftoff tools and methods to perform the metal liftoff process but each of the existing tools and methods have problems overcome by embodiments of the presently disclosed tool and methods. Existing single wafer spin tools are used with the wafer upper surface in a horizontal position with solvent sprayed at a perpendicular angle relative to the wafer surface. This process method of removal requires a long soak step in a separate tool or tank to allow the layer of resist under the metal to soften and the metal layer to begin to wrinkle. The wrinkle effect is necessary for the downward spraying force to strip the metal away. This is ineffective for high production processes and leaves many metal flags on the wafer surface. In addition, solvent usage is very high and because the lifted metal adheres to the walls of the process tank metal reclaim are common problems when using these tools and methods.

Existing metal liftoff tools and methods using immersion with recirculated tanks are available but have been largely ineffective for metal removal without further processing and hardware. The existing immersion tools employ simply soaking and recirculating the fluid in the immersion tank. This process takes far too long to be effective given current production needs. As a result high velocity low pressure jets have been used to help remove the metal. Given the difficulty of producing high velocity streams in a liquid over a long distance, roller assemblies have been used to spin the wafer allowing higher velocity flow to reach the entire surface of the wafer. The problem with these systems is that some wafers have flats that make the roller assembly ineffective as the wafers with flats cannot be rotated. In addition multiple wafer sizes are not able to be processed in this type of system making them less desirable in general. The existing immersion systems have also had difficulty due to damage caused by the liftoff metal scratching surfaces of the permanent metal layers. The liftoff metal becomes debris in the fluid stream as it is caught in turbulent flow patterns within the process tank. Once caught in this turbulence the metal cycles throughout the solution at high speed sometimes scratching permanent metal layers.

In addition, with many currently available systems much of the liftoff metal must be cleaned out of the process tank manually by draining the system frequently. This is undesirable as it causes considerable downtime and lower productivity in general. During these drain cycles, metal from the liftoff is often caught in valves or pumps causing damage to the components further increasing cost and lowering uptime. Filters also clog frequently and in some instances the process tanks do not drain at all due to blockages. This causes hazardous conditions for the maintenance staff working on the tools.

Embodiments of the presently disclosed tools and methods address such problems through a carefully designed combination of hardware and method steps. The combination of immersion of the wafers, lifting and lowering mechanism to move the wafer surfaces through the primary spray jets for removal of the metal, use of the secondary spray jets to provide pressure equalization forces to move liftoff metal out of the immersion tank metal liftoff process area and the inclusion of the weir configuration of the metal liftoff tool all act synergistically to provide a metal liftoff and simultaneous removal of the lifted metal from the immersion tank such that complete or substantially complete metal liftoff is performed with no or minimal metal flags or ears, redeposition of stripped metal or other incomplete metal liftoff, or damage to the wafers or metal patterns thereon due to metal particles in the fluid. The balance of flow velocities and direction, spray jet sequencing and wafer cassette raising and lowering in the immersion tank fluid provide complete metal liftoff and flushing of the liftoff metal from the immersion tank without the liftoff metal being trapped in the immersion tank or redeposited at wafer contact points.

The foregoing and other objects, features, and advantages of the invention will become more apparent from the following detailed description, which proceeds with reference to the accompanying figures.

BRIEF DESCRIPTION OF THE DRAWINGS

FIG. 1B is a cross sectional view of an embodiment of an immersion tank (or process tank) of the disclosed metal liftoff tool.

FIG. 1D is a partial view of an embodiment of an immersion tank (or process tank) with a wafer cassette and wafers therein, of the disclosed metal liftoff tool.

DETAILED DESCRIPTION

Figure 1A:
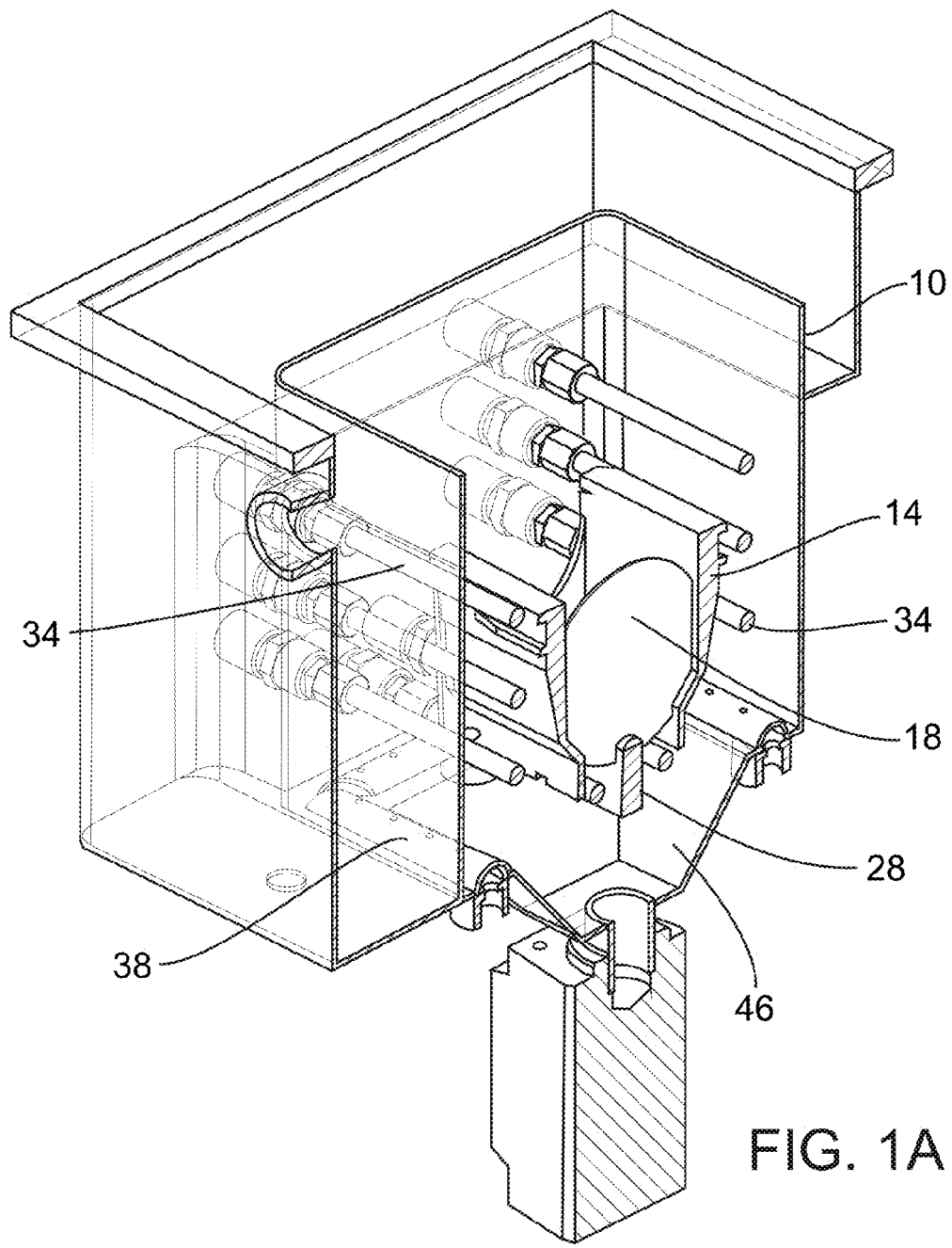
FIG. 1A is a perspective cross sectional view of an embodiment of an immersion tank (or process tank) of the disclosed metal liftoff tool.
Figure 1C:
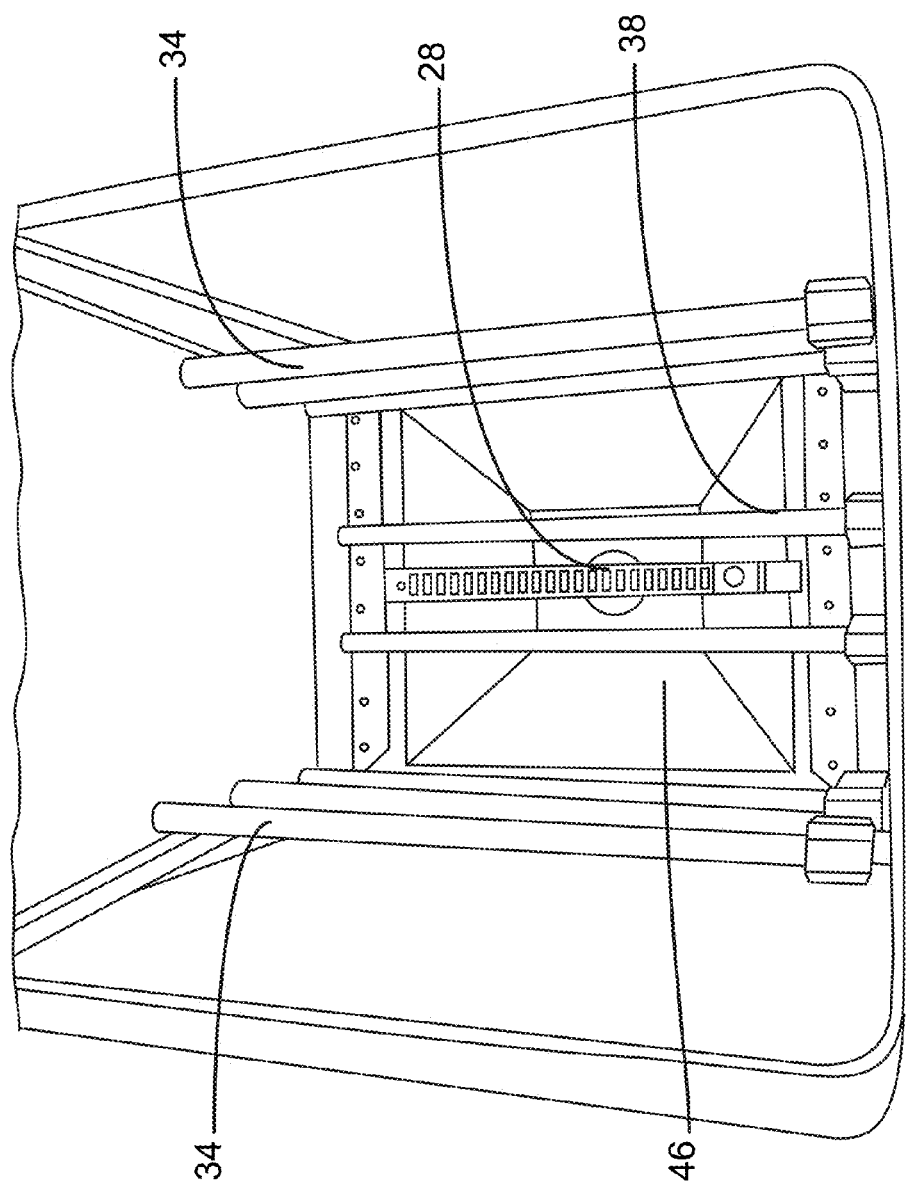
FIG. 1C is an embodiment of an immersion tank (or process tank) of the disclosed metal liftoff tool.
Figure 2A:
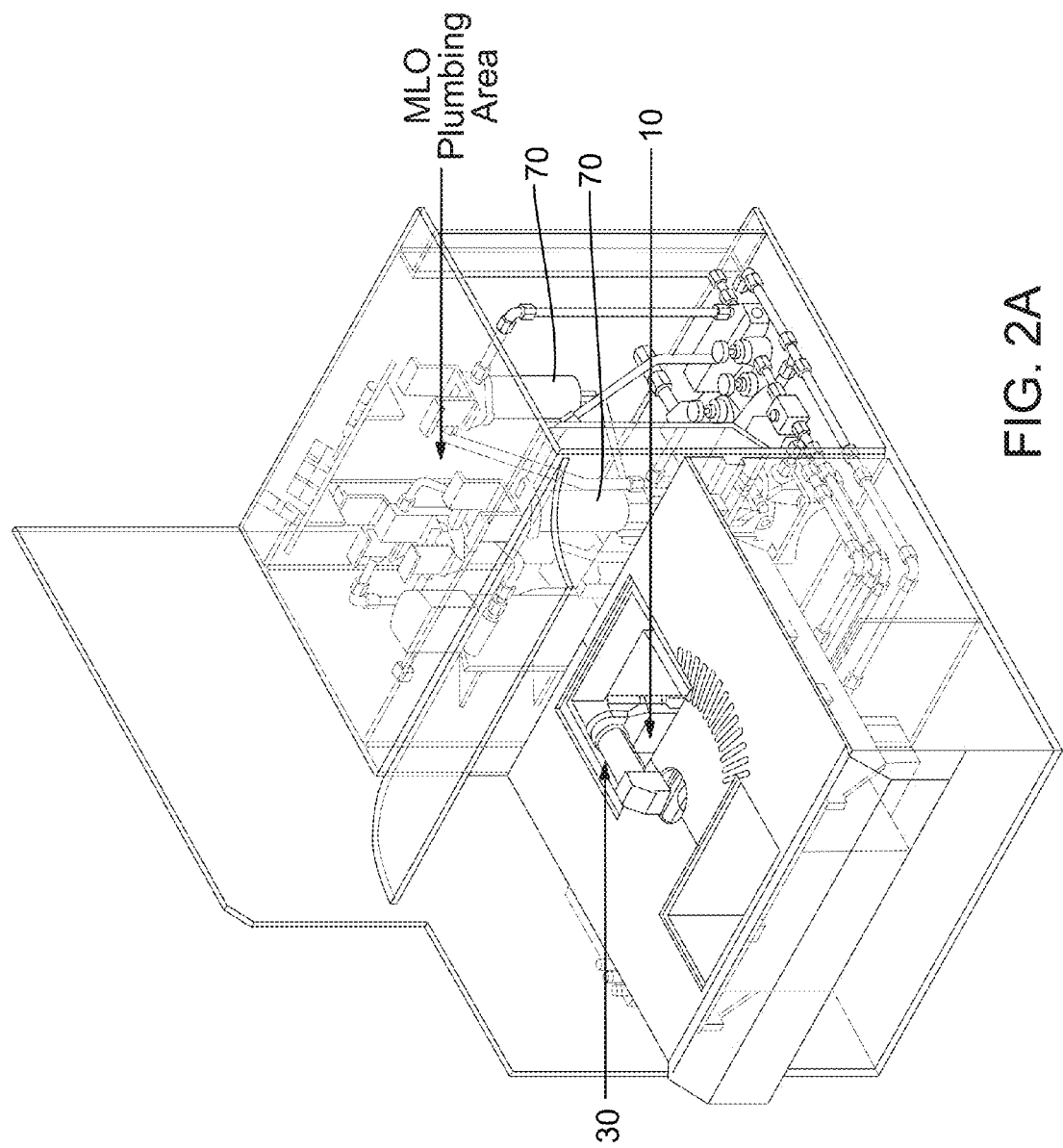
FIGS. 2A and 2B are perspective views of embodiments of the metal liftoff tool illustrating embodiments of the immersion tank (the MLO Process Tank), the lifting and lowering mechanism (Robot Arm with End Effector) that holds the wafer cassette, plumbing, and the reservoir.
Figure 2B:
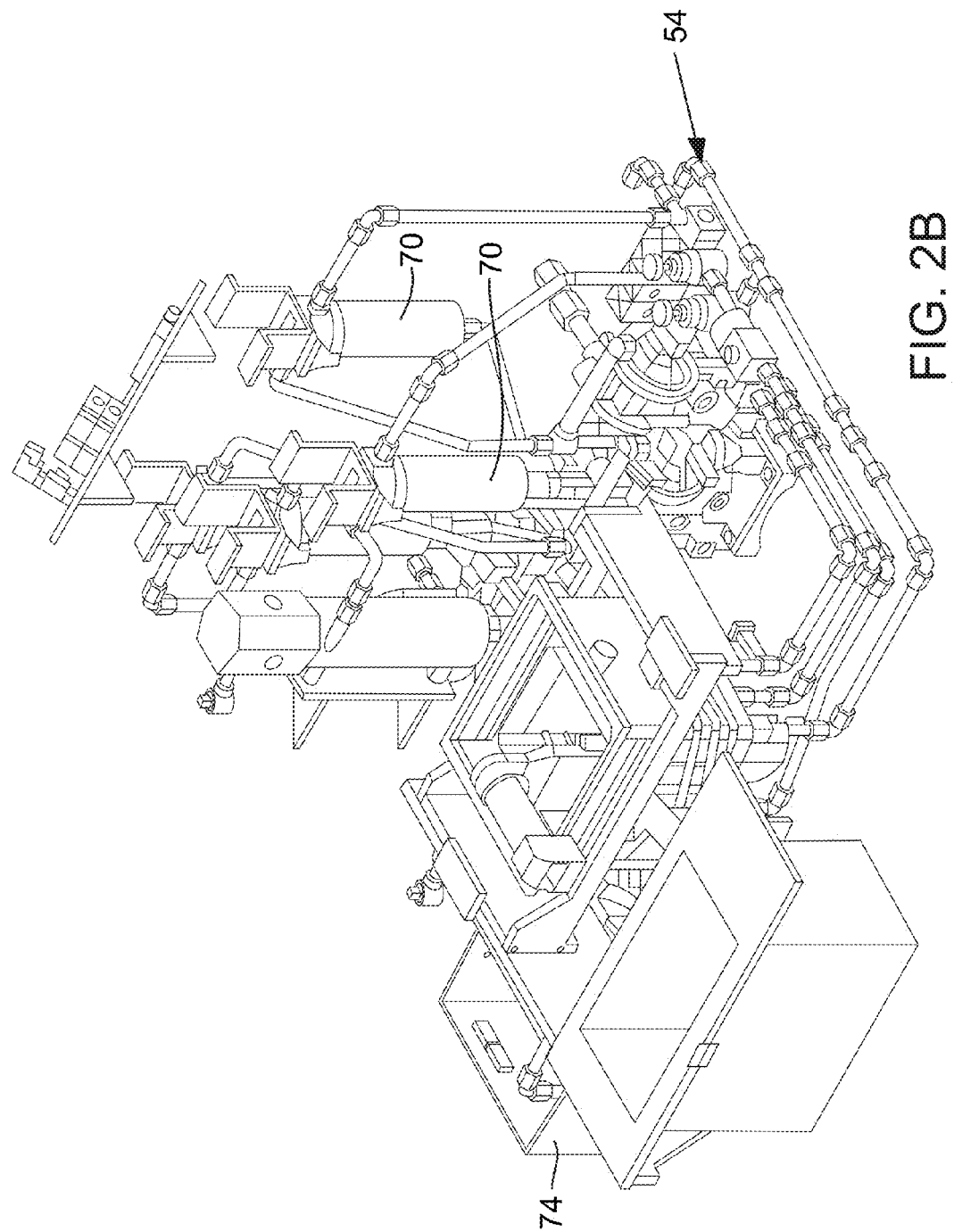

With reference to FIGS. 1A, 1B and 2A, in certain embodiments the metal liftoff tool comprises an immersion tank 10 for receiving a wafer cassette 14 and wafers 18, the immersion tank including an inner and outer weir 22 and 26, respectively, a lifting and lowering mechanism 30 capable of raising and lowering a wafer cassette while the cassette and wafers therein are submerged in fluid in the immersion tank, low pressure high velocity primary spray jets 34 for lifting off the metal, the primary spray jets positioned at opposing sides of the immersion tank, and low pressure high velocity secondary spray jets 38 to provide pressure equalization force, the secondary spray jets positioned at the bottom of the immersion tank. A wafer lift insert 28 is positioned at the bottom of the immersion tank to receive and periodically lift the wafers within the cassette such that portions of the wafer surface in contact with the cassette when not lifted by the wafer lift insert are exposed to the primary spray jets 34 fluid streams to ensure complete or substantially complete metal liftoff of the entire wafer surface.

As used herein "wafer" means a slice of semiconductor material, such as a silicon, silicon carbide, sapphire, germanium or GaAs, used in the fabrication of integrated circuits and other microdevices. As used herein, "wafer" includes wafers having thicknesses of, for example, 200-300 µm, 160 µm, 375 µm, 525 µm, 625 µm, 675 µm, 725 µm, 775 µm, 925 µm or other currently available thicknesses or possible thicknesses as known to those skilled in the art. As used herein, "wafer" includes wafers having diameters of 25.4-450 mm or 100-300 mm in diameter or other currently available diameters or possible diameters as known to those skilled in the art.

The immersion tank 10, also called the process tank, can be of any configuration and dimension suitable for receiving the wafer cassette and accommodating the primary and secondary spray bars or jets 38 positioned as described herein. The immersion tank may comprise a square or rectangular container made of materials compatible with the solvents and/or acids required to strip the wafers. Because the immersion tank does not include moving parts, the tank may be formed of stainless steel or a plastic, or like material(s). Certain embodiments of the immersion tank include four side walls and a bottom sized to include a stationary wafer lifting assembly 28 contacting the wafers on edge to minimize contact surface of each wafer to lift the wafers in the wafer cassette to ensure all portions of the wafer surface are exposed to the primary spray jets 34 and undesired metal is stripped from the wafer surfaces in a standard wafer cassette which wafers have surface areas that may contact the cassette. Certain embodiments include a single central or dual side mounted wafer lift inserts or lifting assembly.

Figure 14:
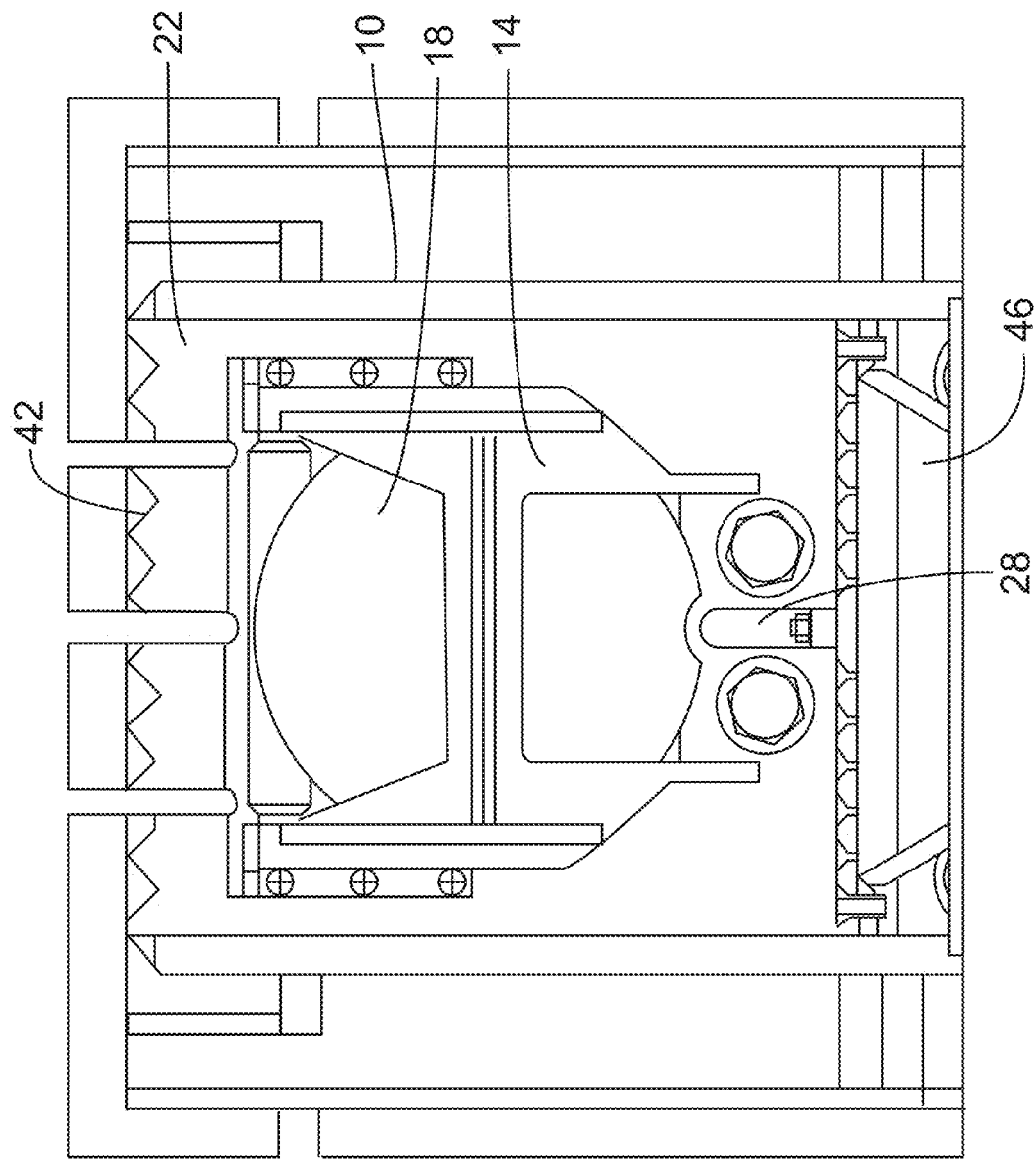
FIG. 14 is an end view of the rinse tank of FIG. 13.
Figure 15:
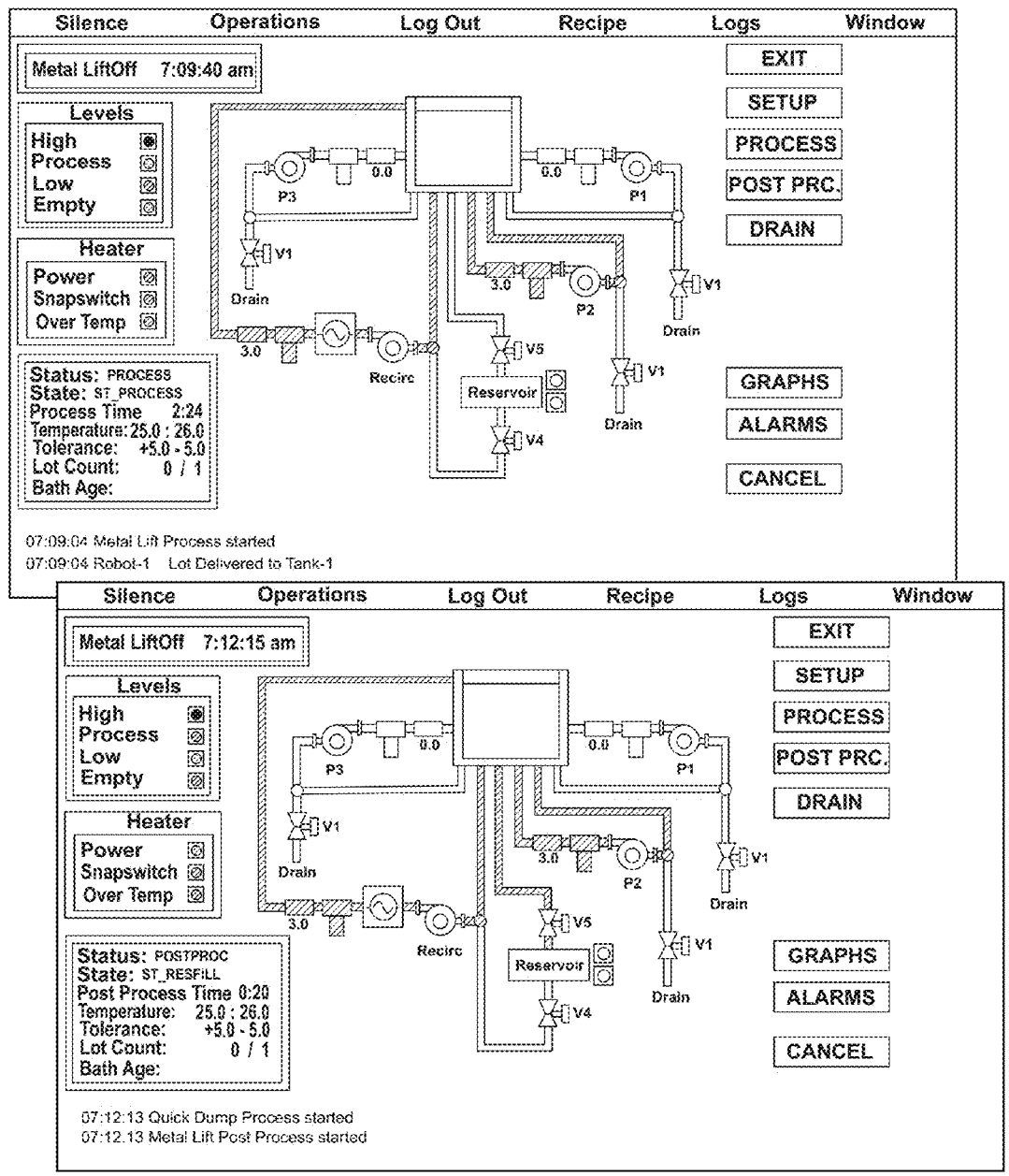
FIG. 15 illustrates an embodiment of the disclosed metal liftoff tool including software control of the fluid flow devices allowing for independent control of fluid circulation pumps, adjustable cycle durations and sequencing, high-turbulence balanced flow, primary and secondary spray jets and automatic tank cleaning post process cycles to maximize process time while minimizing solvent usage.

In certain embodiments, as shown in FIG. 1B, the immersion tank 10 includes an inner weir 22. The inner weir 22 is configured such that in combination with fluid forces caused by the secondary spray jets 38, liftoff metal removed from the wafers is forced to the top of the fluid in the immersion tank and flows over the weir 22 into an outer reservoir or outer weir 26. This minimizes damage to the wafer surface due to metal debris and aids in preventing redeposition of metal onto the wafer surface. As shown in FIG. 1B and FIG. 14, in certain embodiments the inner weir includes an edge 42 with a serrated configuration; the serrated configuration aids in providing a maximum fluid column or flow out of the inner weir to allow liftoff metal pieces to flow freely from the inner weir without catching on the edge thereof due, in part, to fluid tension forces.

Figure 8:
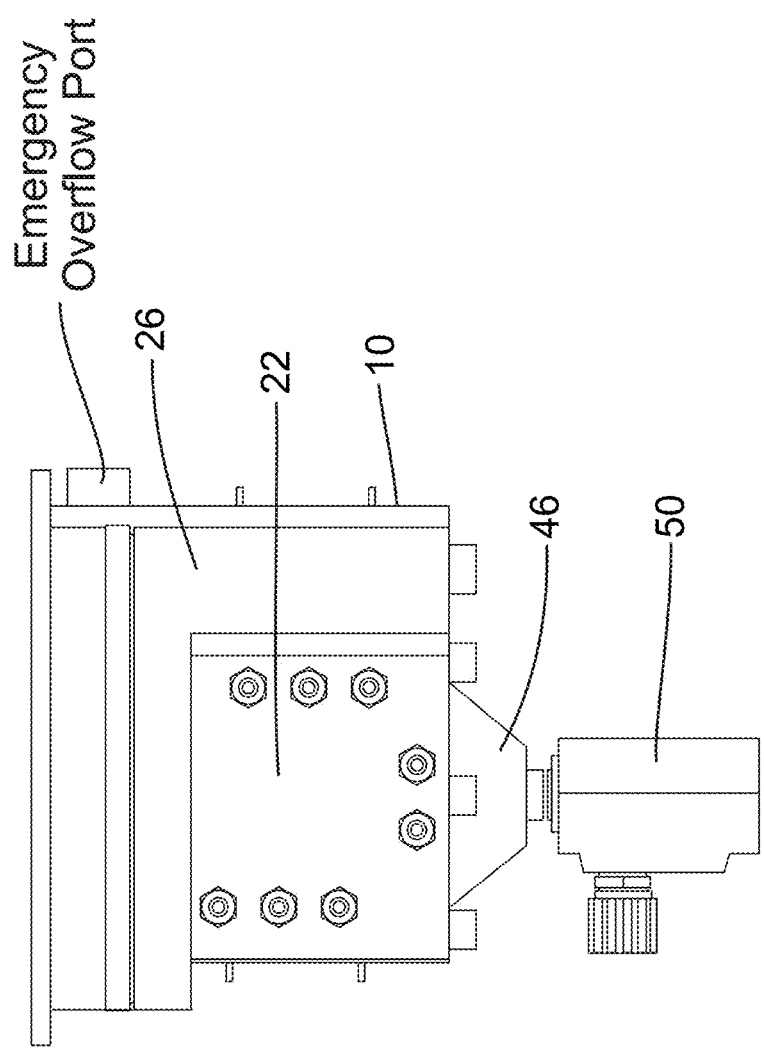
FIG. 8 is a side view of an immersion tank (process tank) in an embodiment of the metal liftoff tool.
Figure 9:
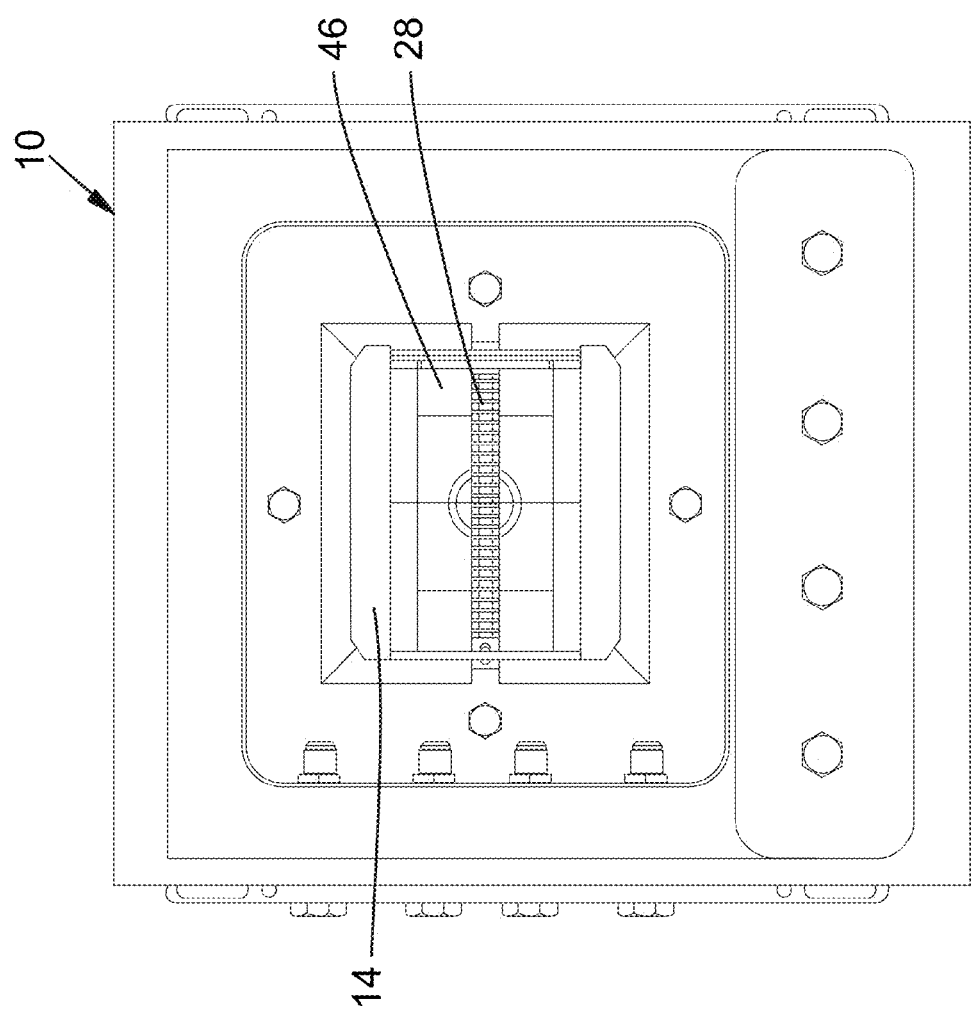
FIG. 9 is a top view of an immersion tank (process tank) in an embodiment of the metal liftoff tool.

In certain embodiments the immersion tank 10 further comprises an outer weir 26 (FIG. 8). The outer weir receives the high velocity fluid flow from the inner weir 22 along with the liftoff metal pieces.

In certain embodiments the immersion tank further comprises a recessed area (dead zone) 46 at the bottom of the inner weir 22 under the location where the wafer cassette 14 is placed, for capturing liftoff metal that is not forced over the inner weir 22 (FIGS. 1B and 8). The recessed area 46 of the tank is below the level of the process flow and pressures created by the primary and secondary spray jets 34, 38. The dead zone 46 allows the metal pieces that for various reasons do not make it out of the inner weir 22 to settle in this area. In certain embodiments the sides of the dead zone 46 are sloped to assist the metal in moving to the center of the zone. In certain embodiments, under the center of the dead zone 46 a piston valve 50 (FIG. 8) is connected thereto such that when opened between process cycles, metal pieces in the dead zone flow down to a secondary fluid reservoir. Further embodiments include a screen placed before or after the piston valve 50 to collect the metal pieces for reclamation.

Figure 4:
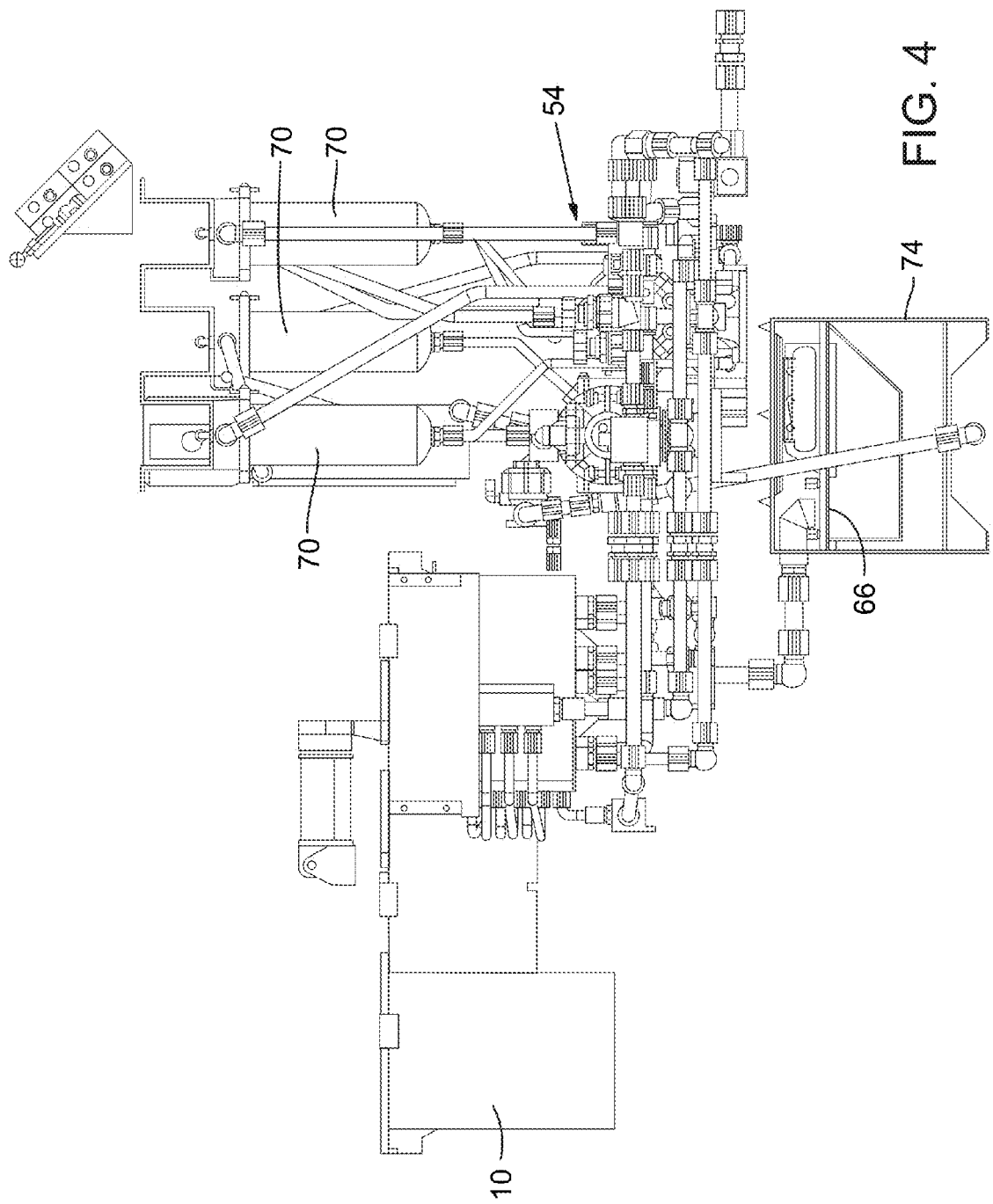
FIG. 4 is a side view of an embodiment of the metal liftoff tool including a trap screen that traps lifted metal.

Embodiments of the disclosed metal liftoff tool further comprise a lifting and lowering mechanism 30 that attaches to the wafer cassette 14 to raise and lower the wafers 18 in the wafer cassette in the immersion tank 10 (FIGS. 2A and 4). The lifting and lower mechanism 30 may comprise any suitable device, as known to those of ordinary skill in the art, which is capable of connecting to and raising/lowering the wafer cassette with wafers therein.

Embodiments of the metal liftoff tool further comprise primary and secondary spray jets 34, 38 (FIGS. 1A-C and 10A). The spray jets may comprise any suitable low pressure high velocity spray jets that can withstand the solvents (including possibly acids) used for the metal liftoff process, and take any suitable form such as individual spray devices (not shown) or multiple spray jets formed in a bar configuration. The primary spray jets 34 are positioned in the inner weir 22 of the immersion tank 10 at opposing sides of the tank such that the primary spray jets are capable of providing a low pressure high velocity fluid stream essentially parallel with the surfaces of the wafers 18 in the wafer cassettes 14. In certain embodiments the fluid streams from the primary spray jets 34 are at an angle of from 0 degrees to 20 degrees relative to the surfaces of the wafers or 0 to 25 degrees. In other embodiments the fluid streams from the primary spray jets 34 are at an angle of from 0 degrees to 15 degrees relative to the surfaces of the wafers. In yet other embodiments the fluid streams from the primary spray jets are at an angle of 15 degrees relative to the surfaces of the wafers.

In certain embodiments the primary spray jets 34 positioned at opposing side walls of the immersion tank 10 are offset vertically from one another such that the jets provide maximum stripping force across the entirety wafers' surfaces (FIG. 1B) as the wafers are lifted and lowered.

One or more secondary spray jets 38 (FIGS. 1A-C and 10A) are positioned in the bottom of the immersion tank 10 to direct fluid flow in a direction upward toward the top of the tank. In certain embodiments the secondary spray jets 38 are formed in a bar configuration such that fluid flow streams are provided along a length of the wafer cassette 14 such that all wafers 18 in the cassette are exposed to the fluid flow upward from the secondary spray jets. The secondary spray jets 38 within the immersion tank 10 provide pressure equalization forces to the tank to lift the liftoff metal to the top of the immersion tank and over the inner weir 22. Without the secondary spray jets providing pressure equalization forces to the tank, the working fluid in the tank begins to form cyclones on either side of the cassette and these circular flows impede the moving of stripped metal pieces from the cassette area as well as cause metal pieces removed to be moved through and between the wafers causing wafer surface damage.

Figure 5:
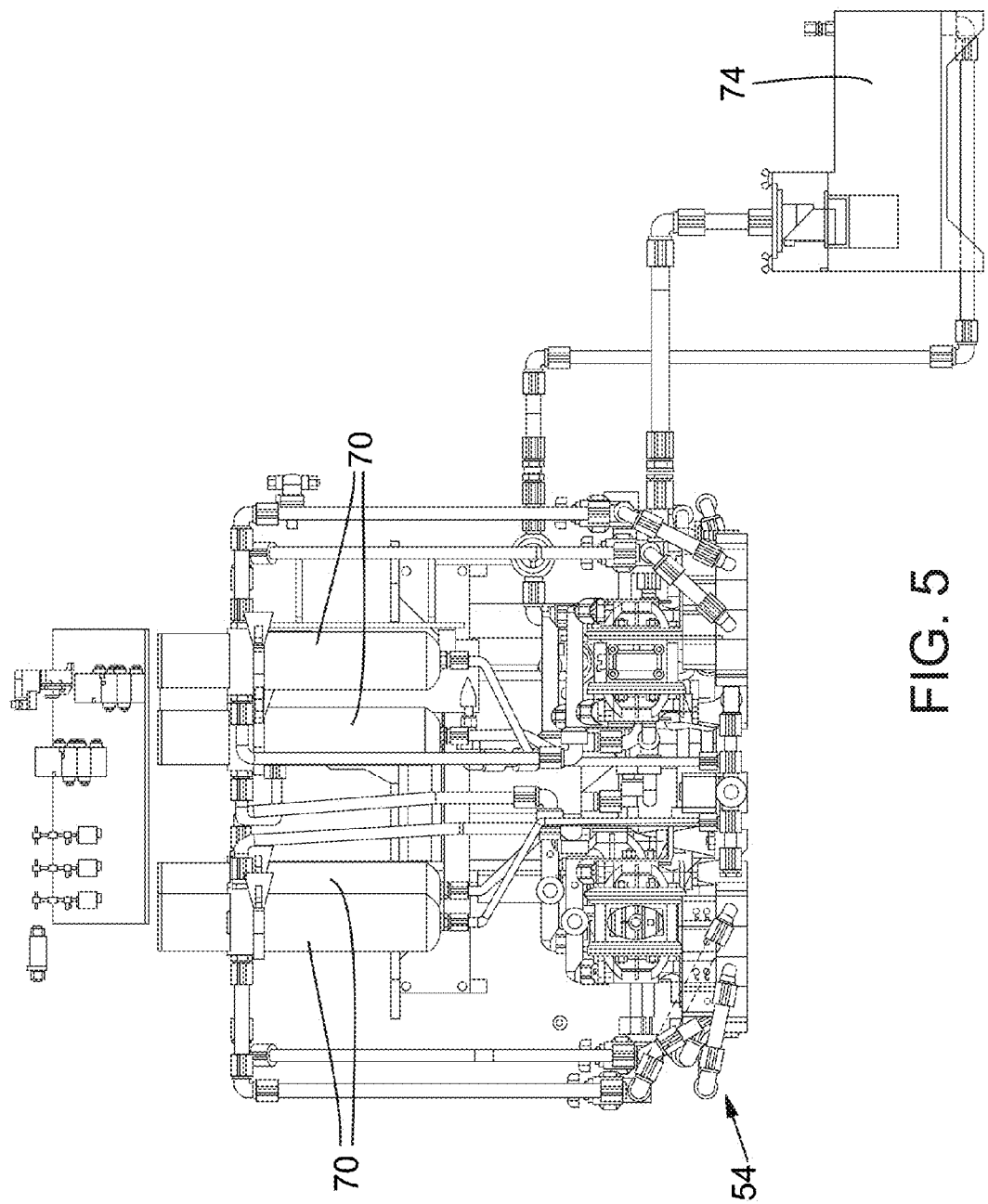
FIG. 5 is a rear view of an embodiment of the metal liftoff tool with recirculation pumps and filters.
Figure 6:
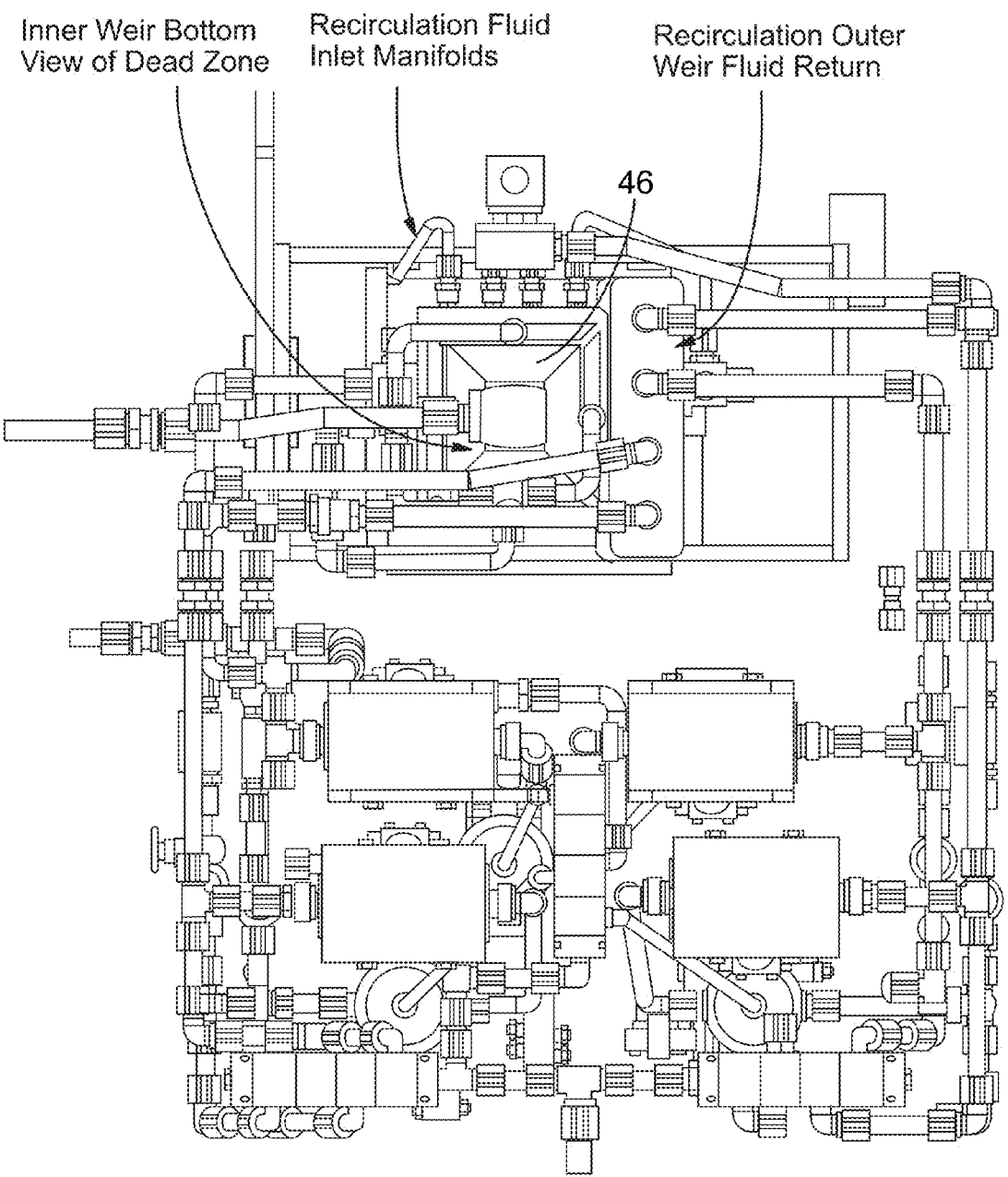
FIG. 6 is a bottom view of an immersion tank in an embodiment of the disclosed tool illustrating connections for recirculation flow and the self-cleaning dead zone.
Figure 7A:
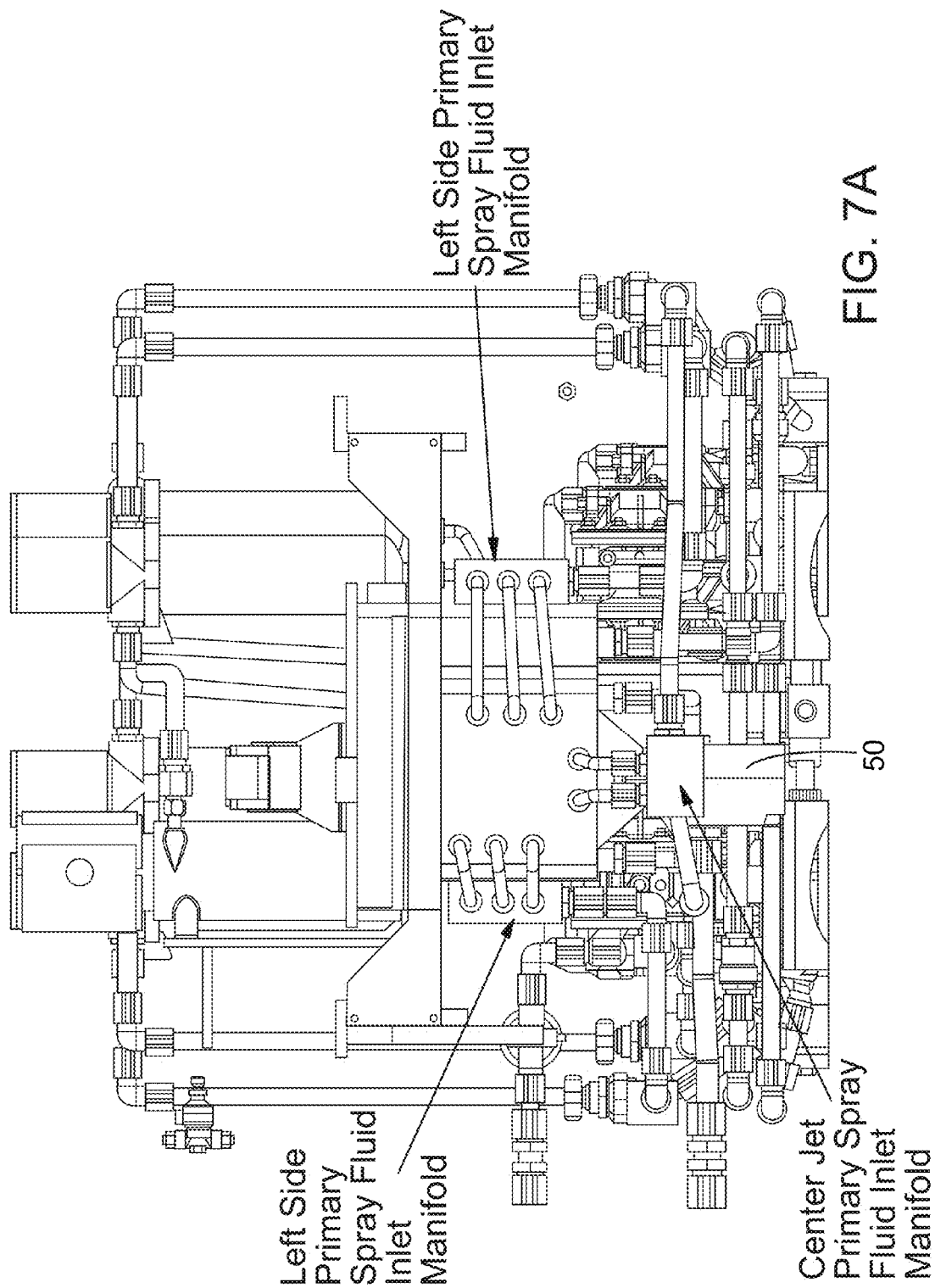
FIG. 7A shows an embodiment of the metal liftoff tool external plumbing features.
Figure 7B:
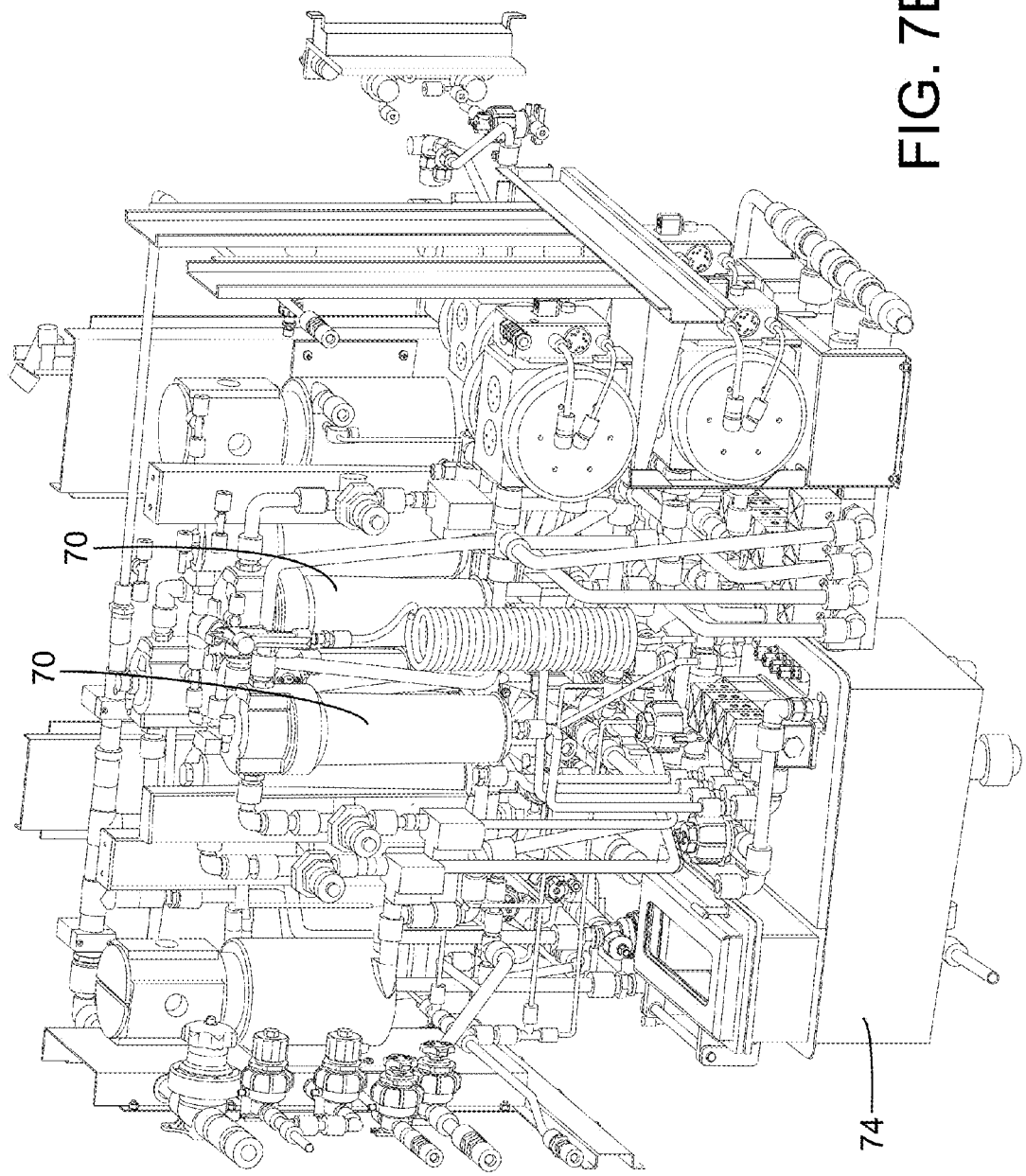
FIG. 7B shows an embodiment of the metal liftoff tool external plumbing features including the reservoir tank.
Figure 10A:
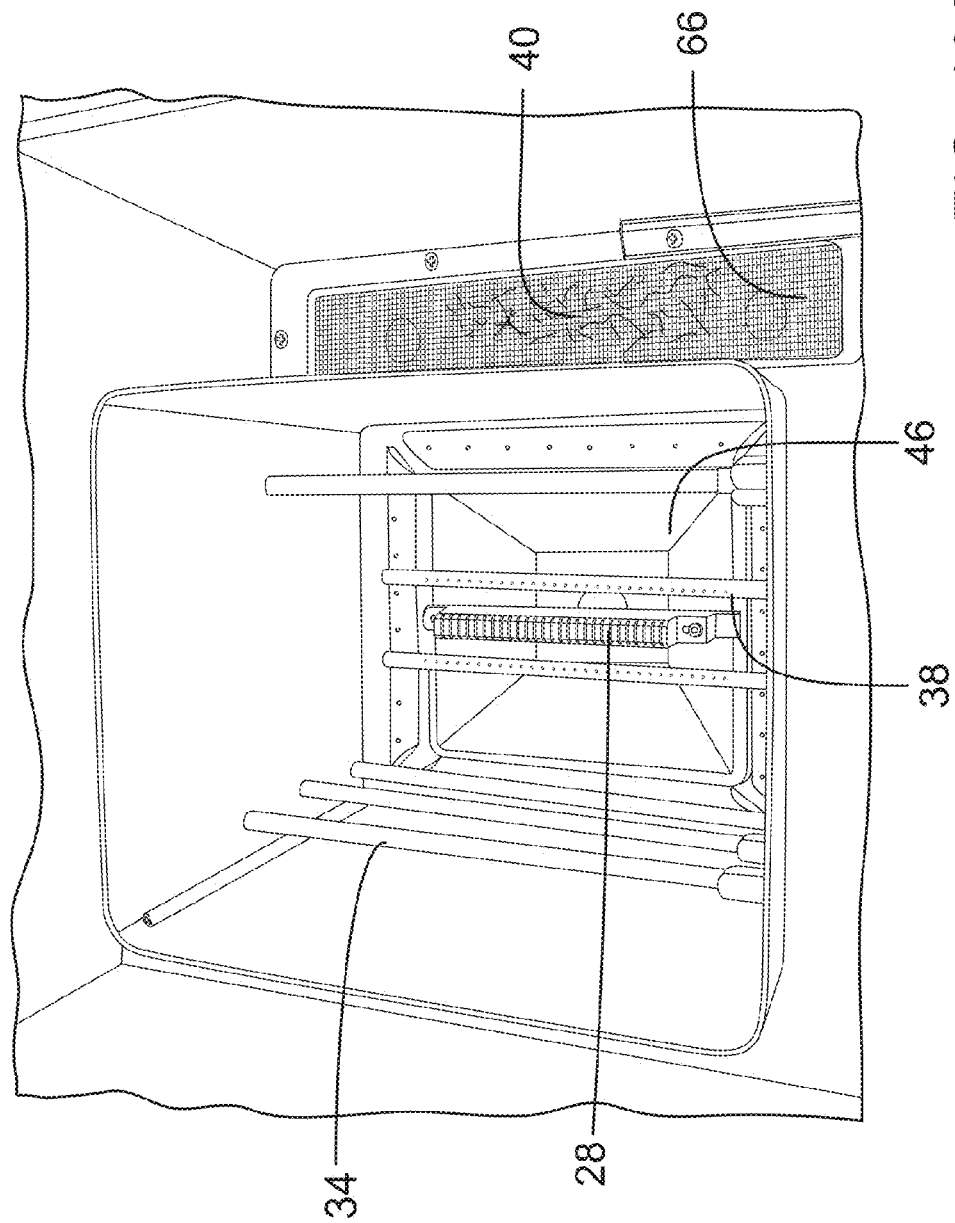
FIG. 10A is a top view of an immersion tank in an embodiment of the metal liftoff tool.

In certain embodiments of the metal liftoff tools further comprise recirculation plumbing and pumps (FIG. 5) to capture the solvent or other fluid flowing from the immersion tank and recirculate the same for re-use. FIG. 5 shows an embodiment of the recirculation pumps and filters that make up the process plumbing 54 and provide clean fluid to the stripping spray jets inside the immersion tank. FIG. 6 shows the immersion tank 10 from a bottom view, illustrating an embodiment of connections 58 for recirculation flow as well as the self-cleaning dead zone 46. Recirculation is a particularly useful feature as the solvent or other fluid is typically prohibitively expensive if used and flowed through a system at the flow rates used herein without recirculating. Further, such recirculation provides an environmentally friendly liftoff tool. Recirculation is possible in part due to the removal of the majority of the liftoff metal pieces 40 from the inner weir by one or more screens 66 or filters connected to the outer weir (FIGS. 10A and B).

Figure 10B:
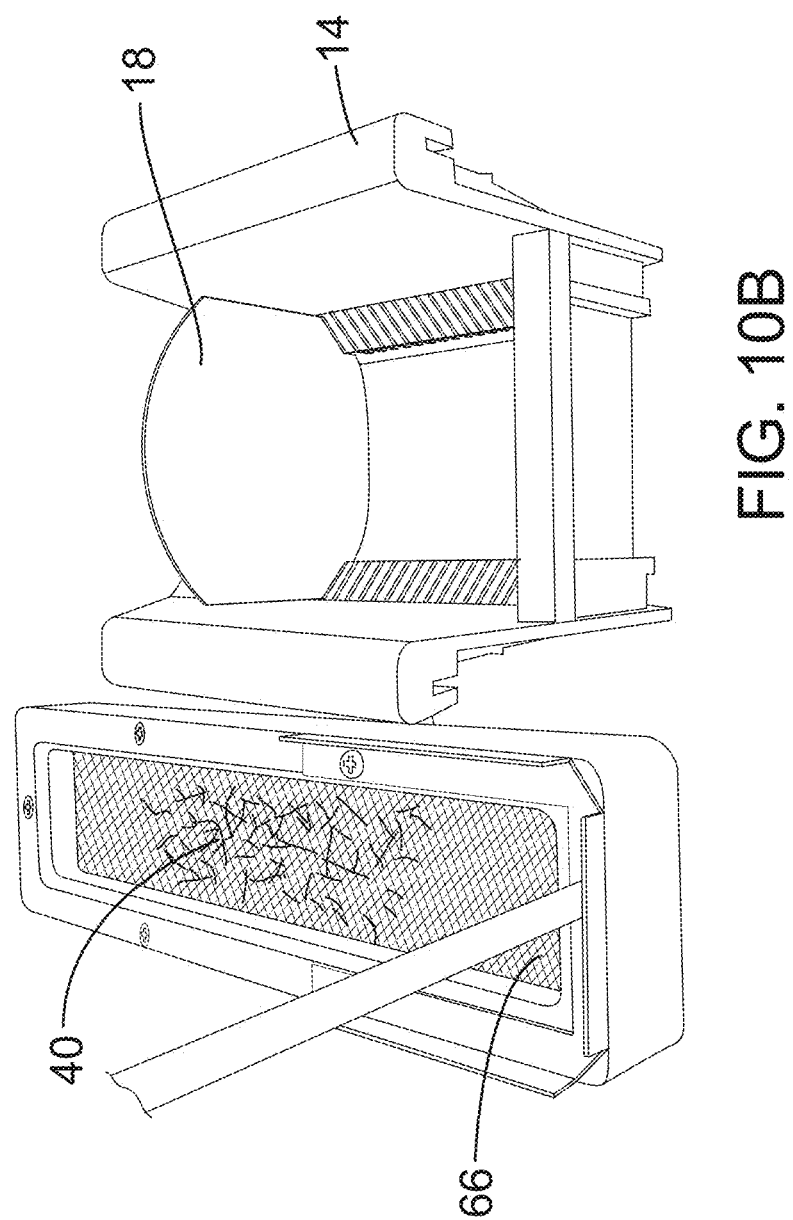
FIG. 10B is a top view of a metal liftoff screen for reclamation.

The presently disclosed metal liftoff tools including such immersion tanks utilizing screens 66 and filters to trap metal prevent metal pieces 40 from reaching drain valves, filters or pumps. Screens may be included in the inner weir 22 over the drain port and in the outer weir 26 to trap metal from reaching the pumps (FIGS. 4, 10A and 10B). One or more screens 66 may also be included at an inlet of the reservoir 74 (FIG. 4). Certain embodiments further comprise filters 70 positioned after one or more of the pumps to filter small particles or fragments of metal to protect the primary and secondary spray jets and manifold assemblies from blockages caused by liftoff metal debris 40 when recirculated solvent is used (see, e.g. FIG. 5). In addition, the metal pieces trapped by the filters and screens may be retrieved for reclamation saving in costs and providing a more environmentally friendly liftoff tool.

In general, embodiments of the metal liftoff methods comprise submerging a wafer cassette 14 with wafers 18 therein to be processed into a fluid in an immersion tank 10, the fluid being a liquid solvent for undermining the sacrificial layer under the metal layer to be removed. Edges of the wafers proximal to the bottom of the immersion tank 10 are periodically lifted by the wafer lifting assembly 28 as the lifting mechanism 30 lowers the wafer cassette into the immersion tank. Streams of low pressure, high velocity fluid are sprayed from the primary spray jets 34 positioned at side walls of the immersion tank 10 in a direction parallel with the or at a slight angle, e.g. 0-20% or 0-15% or 15% relative to surfaces of the wafers 18 when in the immersion tank, thereby undercutting the resist layer (or other sacrificial material) and providing maximum metal stripping force across the entire surface of the wafers. The wafer cassette 14 and wafers 18 are raised and lowered in the immersion tank 10 through the streams of fluid from the primary spray jets 34 to provide a complete or substantially complete metal liftoff. Fluid is simultaneously and/or intermittently sprayed from one or more of the secondary spray jets 38 positioned on the bottom of the immersion tank 10 to provide pressure equalization forces that causes the majority of the stripped metal pieces to move to the top of the immersion tank and flow from the inner weir 22 to the outer weir 26.

In certain embodiments of the disclosed methods, wafers with deposited metal layers are placed inside a standard Teflon® wafer process cassette. The process cassette 14 is connected to a lifting and lowering mechanism 30, such as an MEI Robot End Effector (MEI, LLC, Albany, Oreg.). The lifting and lowering mechanism 30 lowers the wafers 18 in the cassette 14 into the immersion tank 10. The immersion tank 10 is filled with a solvent for removing the sacrificial layer, such as a liquid in the form of either acid chemicals (performed using a chemically compatible plastic tank) or organic solvents (performed using a suitable tank material such as stainless steel) using low pressure high velocity primary spray jets 34 of fluid. The primary spray jets 34 positioned on opposing sides of the cassette 14 within the inner weir 22 of the immersion tank 10 spray the solvent or other liquid being used across the entire surface of the wafer 18 at a flow rate at the spray jet outlets of greater than 10 liters/minute, such as 10-20 liters/minute or 17-20 liters/minute. In certain embodiments, during the strip cycle the secondary spray jets 38 are on and the left and right sidewall primary spray jets 34 are alternatingly on to strip the metal from the surfaces of the wafers. The secondary spray jets 38 provide lift to the primary spray jets 34 lateral movement and the two forces combine to sweep the surfaces of the wafers 18. Other on/off sequences for the spray jets may be used in certain embodiments.

In certain embodiments, periodically a short cycle of all pumps being on is used to flush off any small metal pieces that may have redeposited during a "wait time" where all pumps are off an liftoff metal pieces are allowed to settle. The drain is then opened to allow the metal pieces 40 settled in the dead zone 46 to evacuate the immersion tank 10 to the reservoir where the fluid is screened and filtered before returning the working fluid to the immersion tank. After that point, in certain embodiments one or more of the pumps may be on with repetitive wait and drain times until the wafers are completely or substantially completely stripped.

The lifting and lowering mechanism 30 moves the wafer cassette 14 with wafers 18 therein in a vertical direction (up and down) through the primary stripping jet 34 streams of fluid to provide a complete or substantially complete metal liftoff process. In certain embodiments, the wafer cassette 14 is cyclically, intermittently or periodically raised and lowered for a total distance movement of from 1-5 inches, from 1-3 inches, or from 1-2 inches.

The secondary spray jets 38 within the immersion tank 10 positioned at the bottom of the tank under the wafer cassette 14 and wafers 18 therein to spray a low pressure high velocity solvent or other liquid being used streams in an upward direction, such as directly perpendicular relative to planes defined by surfaces of the immersion tank sidewalls, to provide pressure equalization forces in the immersion tank, moving the liftoff metal pieces toward the top of the immersion tank and over the inner weir 22. The secondary spray jet 38 flow rates at the spray jet outlets is a rate greater than 1 liter/minute, or greater than 5 liters/minute, or greater than 10 liters/minute, such as 10-20 liters/minute or 17-20 liters/minute. Once the liftoff metal pieces 40 are carried by the high velocity flow to the outer weir 26, the metal pieces are caught by the primary recapture screen 66 in the outer weir 26 (FIGS. 10A and 10B). The primary recapture screen 66 may take any suitable form and shape, such as being shaped in a basket form to allow easy removal for emptying between process cycles.

In certain embodiments during the stripping process the wafers 18 in the wafer cassettes 14 are resting on the wafer lifting assembly 28 as the secondary spray jets 38 force fluid in an upward direction. In certain embodiments the wafers are raised off of and lowered back onto the lifting assembly 28 to lift the wafers out of the cassette cradle. This action, in certain embodiments, is repeated throughout the stripping process cycle and may be performed during just a portion of the stripping process. Wafers 18 are lifted up a distance within the wafer cassette 14 by contact with the wafer lifting assembly 28 while the primary and/or secondary spray jets 34, 38 are streaming fluid to ensure the wafer surface is completely stripped by the fluid jets. Wafers in the wafer carriers/cassettes mask metal in lower corners of the wafer surface at positions of 4 and 8 o'clock inhibiting metal removal if the wafers are not lifted within the cassette as part of the process.

In certain embodiments, the stripped metal pieces 40 that are not lifted over the inner weir 22 fall into the reservoir or dead zone 46 at the bottom of the inner weir immersion tank 10. In certain embodiments, this recessed area 46 of the tank is below the level of the process flow and pressures created by the primary and secondary jets. In certain embodiments, the sides of the dead zone 46 are sloped to assist the metal pieces 40 to move to the center of the zone. In certain embodiments of the disclosed methods a piston valve under the dead zone 46 is opened between stripping process cycles to allow the metal pieces trapped in the dead zone to flow freely down to a secondary fluid reservoir. As the fluid flows into the reservoir the reservoir trap captures the metal pieces while still allowing the fluid to flow into a lower chamber of the reservoir. In certain of the disclosed methods the screen 66 is removed between cycles to allow it to be cleaned and the metal pieces reclaimed.

In certain embodiments of the metal liftoff methods the fluid in the reservoir is cycled back to the immersion tank by the use of a pump in combination with level sensors. The pump may also serve as a circulation pump for the secondary spray jets.

Certain embodiments of the disclosed metal liftoff tools and methods provide advantages over existing single wafer spin tools or immersion tools using roller technology. In certain embodiments of the disclosed metal liftoff tools and processes multiple wafer sizes can be processed in a single tank. In certain embodiments using the stationary wafer lifting assembly, wafers with flats can be substantially stripped or stripped completely. Because the present embodiments of the tools and processes disclosed do not include roller assemblies, the presently disclosed tools and methods can lift the wafers within the cassette to allow edge metal to be flushed up and out of the immersion tank even where the wafers include flats.

Embodiments of the disclosed metal liftoff tools and processes include immersion tanks configured to optimize fluid flow out of an inner weir 22 to remove the maximum amount of liftoff metal pieces from the inner weir where wafers are processed. This minimizes damage to the wafer from metal debris. The embodiments having one or more screens and filters trap metal pieces from reaching drain valves, filters or pumps to protect the spray jets and manifold assemblies from blockages and to allow for metal recovery.

Figure 3:
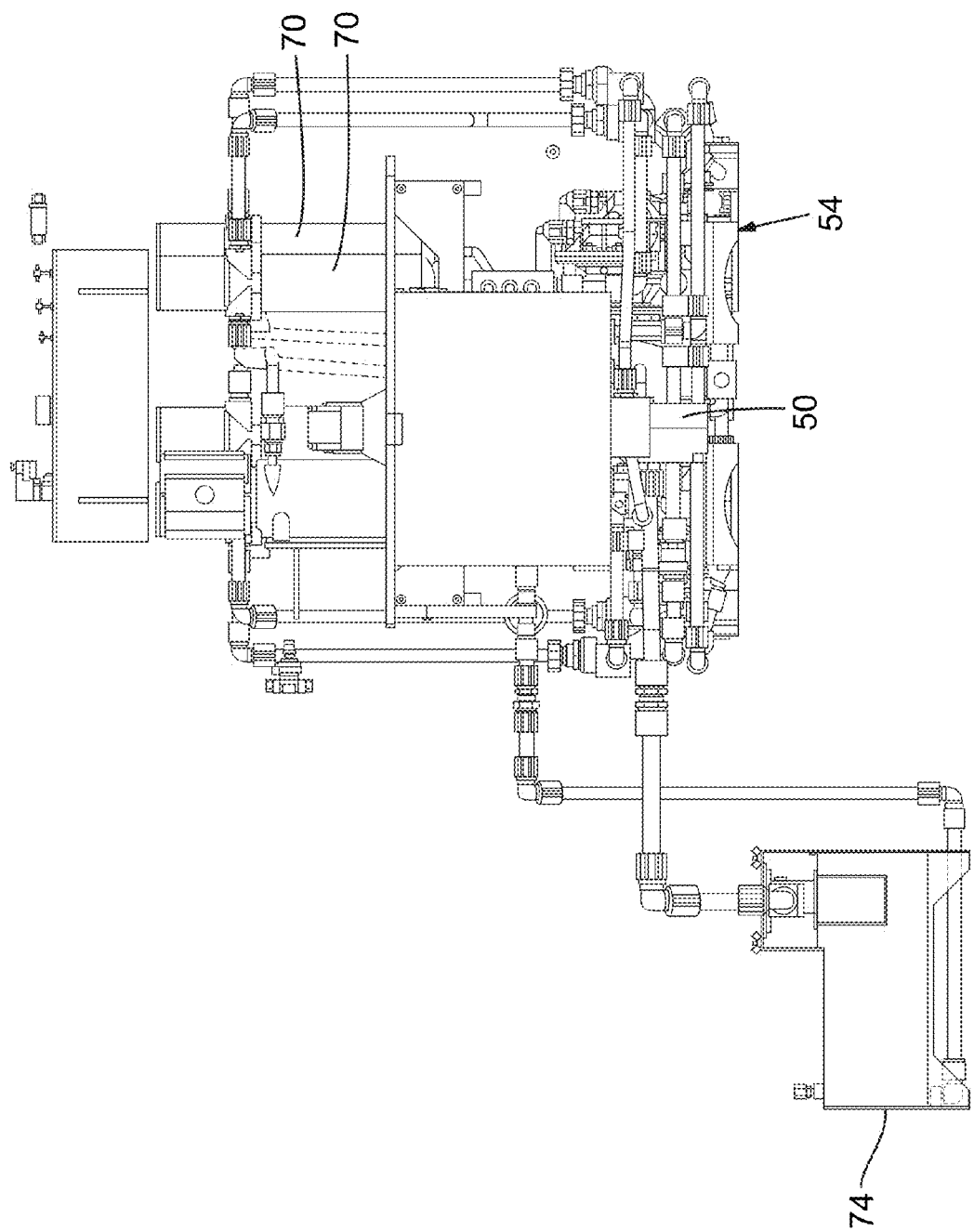
FIG. 3 is a side view of an embodiment of the metal liftoff tool including a fluid reservoir positioned lower than the immersion tank. When the large diameter self-cleaning valve opens gravity forces fluid to fall into the reservoir passing through a trap screen (FIG. 4) which traps the lifted metal, leaving the immersion tank clean and ready for the next wafer lot to be stripped.

In certain embodiments the disclosed metal liftoff tools and processes include immersion tanks 10 that are self-cleaning, which minimizes down time and maximizing throughput. By use of the immersion tank inner weir 22 dead zone 46 and large dump valve 50 to the fluid reservoir, metal pieces 40 are captured by the screen 66 and the fluid is recirculated to the immersion tank. The fluid reservoir 74 shown in FIG. 3 sits lower than the immersion tank such that when the large diameter self-cleaning valve 50 opens, gravity forces the fluid to fall into the reservoir 74 and in some embodiments pass through the trap screen 66 (FIG. 4) which traps the metal, leaving the immersion tank clean and ready for the next wafer lot to be stripped.

Certain embodiments may further comprise software to accelerate the metal removal process by allowing maximum flexibility in solvent strip jet cycles. Because, as known to those of ordinary skill in the art, different metal layers are stripped effectively using different cycle sequences to remove. The software allows maximum flexibility to the user to tune a process sequence that works best for the particular metal being stripped.

In certain embodiments ultrasonic energy is used in the fluid process tank. The ultrasonic energy may be used, e.g., to remove thin layers of negative resist and/or to assist with the metal removal. Varying frequencies of the ultrasonics (between 170 K Hz and 40 KHz) aids in the stripping of metal without damaging the IC structures on the wafers.

Figure 11:
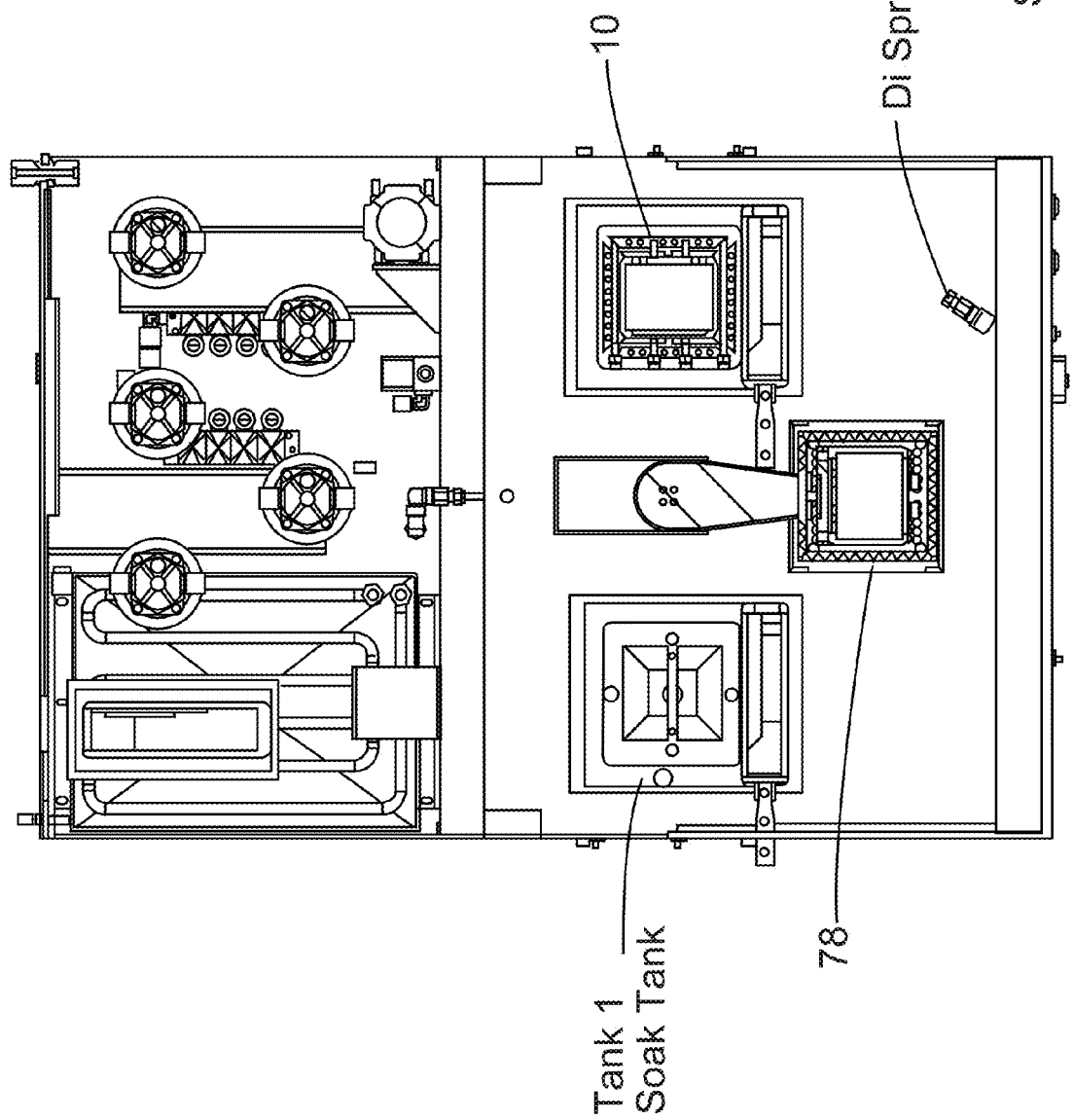
FIG. 11 is a top view of an embodiment of the metal liftoff tool having a soak tank (tank 1).
Figure 12:
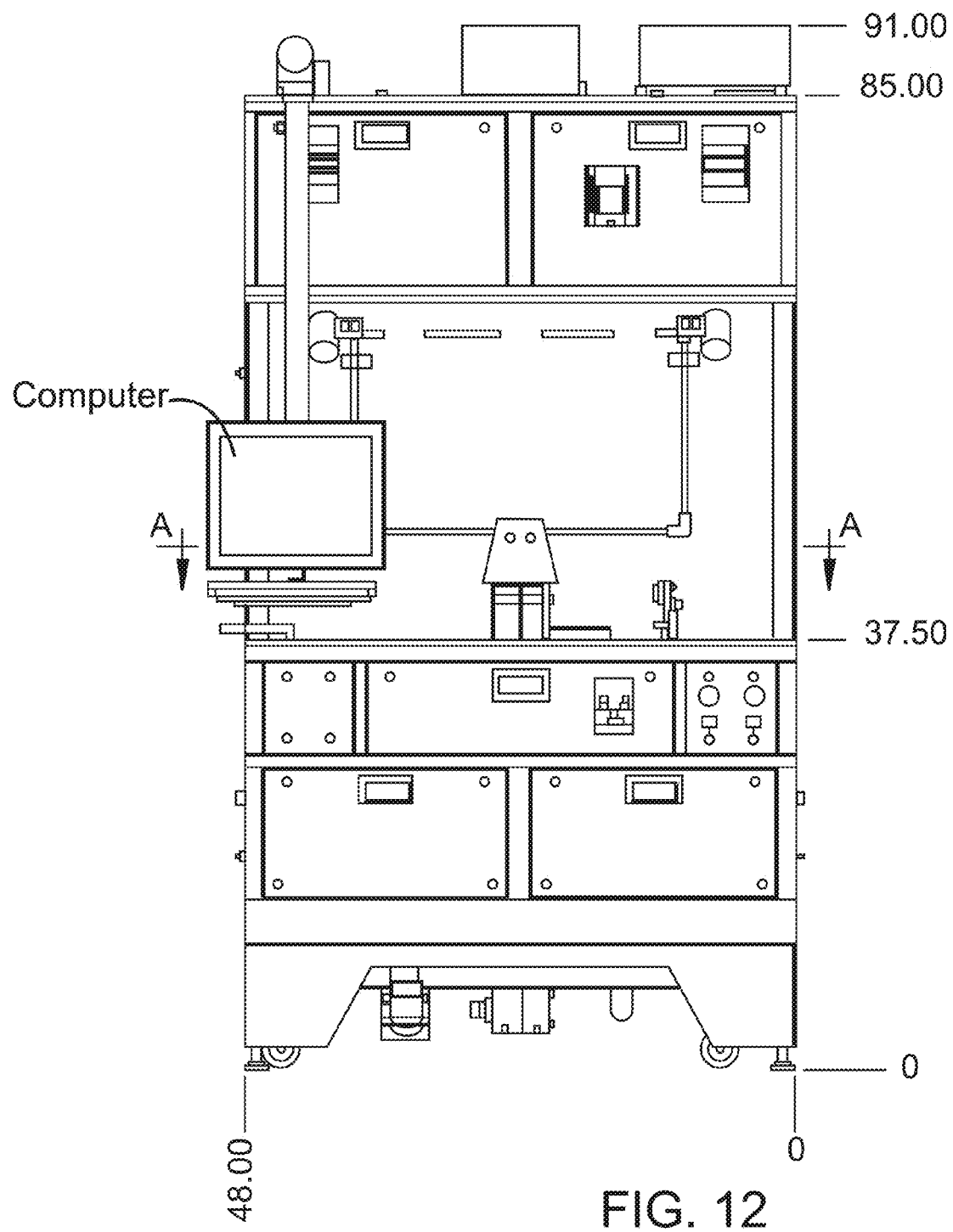
FIG. 12 is a front view of an embodiment of the metal liftoff tool including a computer, keyboard and monitor for inclusion of computer software for operating the metal liftoff tool.
Figure 13:
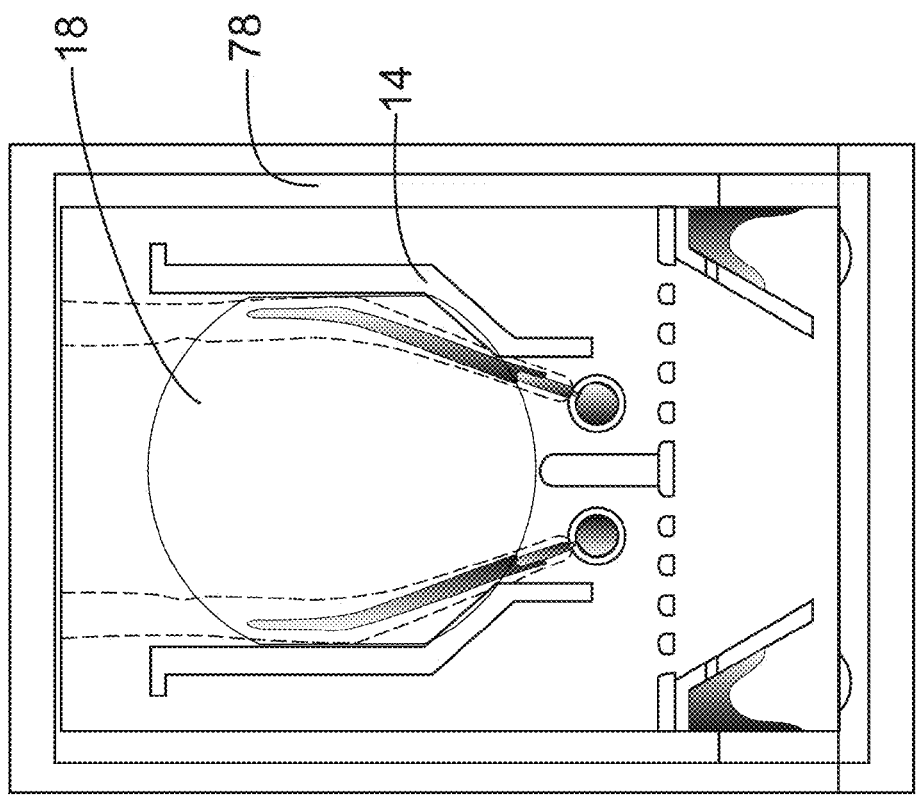
FIG. 13 illustrates fluid flow from embodiments of spray jets in a rinse tank for flushing out redeposited metal or metal flags in an embodiment of the metal liftoff tool.

In certain embodiments, the tools and methods may further comprise a separate wafer rinse tank 78 such as shown in FIGS. 11 and 13, to aid in removal or stripping metal flags, ears, redeposited metal or otherwise incomplete metal stripping.

The present tools and methods can be applied to remove resist or other such materials rather than metal layers.

As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described herein. The materials, methods, and examples are not intended to be limiting unless indicated otherwise.

Unless otherwise indicated, all numbers expressing quantities such as pressure and velocity, properties, percentages, and so forth, as used in the specification or claims are to be understood as being modified by the term "about." Unless otherwise indicated, non-numerical properties, such as fluid flow directions, as used in the specification or claims are to be understood as being modified by the term "substantially," meaning to a great extent or degree. In certain uses, substantially means within 5%, 3%, 2%, or 1%. Accordingly, unless otherwise indicated, implicitly or explicitly, the numerical parameters and/or non-numerical properties set forth are approximations that may depend on the desired properties sought, limits of detection under standard test conditions/methods, limitations of the processing methods, and/or the nature of the parameter or property. When directly and explicitly distinguishing embodiments from discussed prior art, the embodiment numbers are not approximates unless the word "about" is recited.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

The invention claimed is:

1. A metal liftoff apparatus comprising:
   a. an immersion tank having a first and second opposing sidewalls and a bottom, the immersion tank dimensioned to receive a cassette of wafers and a working fluid;
   b. primary spray jets positioned on the first and second opposing side walls of the immersion tank;
   c. secondary spray jets positioned on the bottom of the immersion tank;
   d. a stationary lifting assembly positioned at the bottom of the immersion tank for lifting the wafers a distance from a bottom portion of the cassette such that all portions of the wafer surfaces are exposed to the primary spray jets while submerged in the immersion tank; and
   e. a lifting and lowering mechanism connectable to a cassette of wafers configured to raise and lower the cassette of wafers while in the cassette of wafers remains submerged in the immersion tank.

2. The metal liftoff apparatus of claim 1 further comprising an inner weir in the immersion tank over which the secondary spray jets are configured to spray working fluid stream to force stripped metal pieces from the immersion tank inner weir.

3. The apparatus of claim 2 further comprising a screen configured to capture stripped metal pieces from the working fluid flowed from the outer weir.

4. The apparatus of claim 2 further comprising a filtration loop configured to remove stripped metal particles from the working fluid stream.

5. The metal liftoff apparatus of claim 1 further comprising a recessed area formed in the bottom of the immersion tank in which recessed area stripped metal pieces not forced over the inner weir are collected.

6. The metal liftoff apparatus of claim 5 further comprising a piston valve positioned under the recessed area and connected thereto such that when opened metal pieces in the recessed area flow to a secondary fluid reservoir.

7. The apparatus of claim 1 further comprising an outer weir configured to collect working fluid and stripped metal pieces that flow over the inner weir of the immersion tank.

8. The apparatus of claim 7 further comprising a pump configured to pressurize the fluid stream.

9. The apparatus of claim 7 further comprising a valve configured to independently control the fluid jets.

10. The apparatus of claim 7 further comprising a removable filter-trap.

11. The apparatus of claim 7 further comprising a computer controller and computer software configured to operate the pumps, valves, jets and/or heater.

12. The apparatus of claim 1 further comprising a heater configured to heat the fluid stream and/or working fluid in the immersion tank and/or prior to entering the immersion tank.

13. A metal liftoff apparatus comprising:
   a. an immersion tank having a first and second opposing sidewalls and a bottom, the immersion tank dimensioned to receive a cassette of wafers and a working fluid;
   b. primary spray jets positioned on the first and second opposing side walls of the immersion tank, the primary jets configured to flow streams of working fluid in a direction parallel with planes defined by wafer surfaces in the cassette, while the wafers are immersed in the working fluid;
   c. secondary spray jets positioned on the bottom of the immersion tank configured to direct working fluid flow directly in an upward direction relative to the bottom of the immersion tank;
   d. a stationary lifting assembly positioned at the bottom of the immersion tank and configured to lift the wafers a distance from a bottom portion of the cassette such that no portion of the cassette covers a wafer surface but the wafers remain submerged in the immersion tank when in a lifted position; and
   e. a lifting and lowering mechanism connectable to a cassette of wafers and configured to raise and lower the cassette of wafers while the cassette remains in the immersion tank when raised and when lowered and configured to raise and lower the cassette of wafers simultaneously with operation of the primary spray jets.

* * * * *